United States Patent [19]

Yatsuda

[11] Patent Number: 5,521,453
[45] Date of Patent: May 28, 1996

[54] SURFACE ACOUSTIC WAVE FILTER AND MOBILE COMMUNICATION SYSTEM USING SAME

[75] Inventor: Hiromi Yatsuda, Mitaka, Japan

[73] Assignee: Japan Radio Co., Ltd., Tokyo, Japan

[21] Appl. No.: 376,678

[22] Filed: Jan. 23, 1995

Related U.S. Application Data

[63] Continuation of Ser. No. 158,946, Nov. 29, 1993, abandoned.

[30] Foreign Application Priority Data

Dec. 1, 1992 [JP] Japan ................... 4-321869
Sep. 14, 1993 [JP] Japan ................... 5-229145
Oct. 26, 1993 [JP] Japan ................... 5-267082
Oct. 28, 1993 [JP] Japan ................... 5-270902

[51] Int. Cl.$^6$ ................................. H01L 41/08
[52] U.S. Cl. ........................... 310/313 R; 333/193
[58] Field of Search ................... 310/313 R, 313 B, 310/313 C, 313 D; 333/150–155, 193–196

[56] References Cited

U.S. PATENT DOCUMENTS

| 3,659,231 | 4/1972 | De Vries | 310/313 R X |
|---|---|---|---|
| 4,785,270 | 11/1988 | Kinsman | 310/313 R X |
| 4,803,449 | 2/1989 | Hikita et al. | 333/193 |
| 4,947,073 | 8/1990 | Stokes et al. | 310/313 R |
| 5,202,652 | 4/1993 | Tabuchi et al. | 310/313 R X |
| 5,265,267 | 11/1993 | Martin et al. | 333/193 X |
| 5,287,036 | 2/1994 | Penunuri | 310/313 R |

FOREIGN PATENT DOCUMENTS

2116387  9/1983  United Kingdom .

OTHER PUBLICATIONS

Patent Abstracts of Japan; vol. 15, No. 510, Dec. 1991; & JP-A-03 222 511.
Patent Abstracts of Japan; vol. 15, No. 510; Dec. 1991 & JP-A-3 222 512.

*Primary Examiner*—Mark O. Budd
*Attorney, Agent, or Firm*—Frishauf, Holtz, Goodman, Langer & Chick

[57] ABSTRACT

A composite surface acoustic wave filter includes an interdigitated interdigital surface acoustic wave filter having input and output terminals. Two one-port surface acoustic wave resonators are electrically connected in series to the interdigitated interdigital surface acoustic wave filter respectively at the input and output terminals, the one-port surface acoustic wave resonators having antiresonant frequencies in a stop band that is close to and higher than the passband of the interdigitated interdigital surface acoustic wave filter. Two other one-port surface acoustic wave resonators are electrically connected parallel to the interdigitated interdigital surface acoustic wave filter, the one-port surface acoustic wave resonators having resonant frequencies in a stop band that is close to and lower than the passband of the interdigitated interdigital surface acoustic wave filter.

20 Claims, 34 Drawing Sheets

NORMALIZED FREQUENCY 0.9~1.1
NORMALIZED IMPEDANCE 50 Ω

NORMALIZED FREQUENCY 0.9~1.1
NORMALIZED IMPEDANCE 50 Ω

NORMALIZED FREQUENCY 0.9~1.1
NORMALIZED IMPEDANCE 50 Ω

NORMALIZED FREQUENCY 0.9~1.1
NORMALIZED IMPEDANCE 50 Ω

SURFACE ACOUSTIC WAVE FILTER AND MOBILE COMMUNICATION SYSTEM USING SAME

This application is a Continuation of application Ser. No. 08/158,946, filed Nov. 29, 1993, now abandoned.

BACKGROUND OF THE INVENTION

1. Field of the Invention

The present invention relates to a surface acoustic wave filter, and a composite surface acoustic wave filter composed of a surface acoustic wave filter and a one-port surface acoustic wave resonator, and more particularly to a surface acoustic wave filter having a low insertion loss in the RF band, which is suitable for use in a mobile communication system or the like, a composite surface acoustic wave filter, and a mobile communication system which employs these filters.

2. Description of the Related Art (Interdigitated interdigital surface acoustic wave filter with normal transducers)

FIG. 19 of the accompanying drawings shows a conventional interdigitated interdigital surface acoustic wave filter 11 with normal transducers on a substrate 111. If the number of transducers is indicated by (2m+1), then the bidirectional loss BL (dB) of the interdigitated interdigital surface acoustic wave filter 11 is represented by:

$$BL=10\log\{(2m+2)/2m\}(dB) \quad (1)$$

The bidirectional losses BL for the different numbers of transducers are given in the following table:

| 2m + 1 | BL (dB) |
|---|---|
| 5 | 1.80 |
| 7 | 1.25 |
| 9 | 0.97 |
| 11 | 0.70 |
| 13 | 0.67 |

Since the interdigitated interdigital surface acoustic wave filter 11 shown in FIG. 19 has 5 transducers, its bidirectional loss BL is 1.80 dB. It can be seen from the table that increasing the number of transducers is effective to reduce the bidirectional loss BL.

The input admittance Y of the transducers is expressed by the following equation (2):

$$Y=Ga+jBa+j\omega C_T \quad (2)$$

where $$Ga=Ga'(\sin x/x)^2 \quad (3)$$

$$Ba=Ga'(\sin 2x-2x)/2x^2 \quad (4)$$

$$Ga'=4k\omega^2{}_o C_S N^2/\pi \quad (5)$$

$$x=N\pi(\omega-\omega_o)/\omega_o \quad (6)$$

$$C_T=NC_S \quad (7)$$

$$C_S=\epsilon_o\epsilon_r W \quad (8)$$

$$\omega=2\pi f$$

$$\omega_o=2\pi f_o$$

and $C_S$ represents the capacitance per transducer port, f the frequency, $f_o$ the center frequency, N the number of electrode finger pairs, W the aperture length, $\epsilon_o$ the dielectric constant of vacuum, $\epsilon_r$ the dielectric constant of the substrate, and k the electromechanical coupling coefficient.

The above equations indicate that as the number of electrode finger pairs increases, the radiation conductance Ga increases and the input impedance decreases. Since the transducers are electrically connected parallel to each other in the interdigital configuration, the input impedance is lower as the number of transducers (2m+1) is greater.

To reduce the passband of a surface acoustic wave filter, the number of electrode finger pairs of each transducer is increased. Therefore, the input impedance of each transducer is reduced, making it impossible to increase the number of interdigital transducers due to the impedance limitation. As a consequence, the bidirectional loss of the surface acoustic wave filter is increased, resulting in a greater insertion loss.

For example, it is assumed that the number of electrode finger pairs per input transducer is 22, the number of electrode finger pairs per output transducer is 30, and the aperture length is 20λ (λ is the wavelength of the input signal) in the interdigitated interdigital surface acoustic wave filter 11 with the 5 transducers (the electrode finger pairs are shown as fewer than actual in FIG. 19). The impedances of such interdigitated interdigital surface acoustic wave filter 11 are calculated, and shown in FIGS. 20A and 20B with respect to normalized frequencies ranging from 0.9 to 1.1. FIG. 20A shows the calculated impedances on the input transducers, and FIG. 20B shows the calculated impedances on the output transducers. For a 50 Ω-impedance arrangement, the input and output sides can be matched by using a matching circuit shown in FIG. 21A.

As described above, the bidirectional loss of an interdigitated interdigital surface acoustic wave filter with 5 transducers is 1.80 dB (see the above table). Lowering the bidirectional loss requires that the number of transducers be increased. If the number of transducers is increased, however, the impedances are reduced. For example, a surface acoustic wave filter 12 with 13 transducers on a substrate 121 as shown in FIG. 22 has impedances as shown in FIGS. 23A and 23B with respect to normalized frequencies ranging from 0.9 to 1.1. FIG. 23A shows the calculated impedances on the input transducers, and FIG. 23B shows the calculated impedances on the output transducers. The impedances which are lowered can be matched in a passband by using a 4-element matching circuit shown in FIG. 21B which includes capacitors 32I, 32O added to the matching circuit shown in FIG. 21A. As a result, the surface acoustic wave filter 12 has insertion loss vs. frequency characteristics as shown in FIG. 24. While the bidirectional loss of the surface acoustic wave filter 12 is about 1.0 dB lower than that of the surface acoustic wave filter with 5 transducers, the number of matching elements required is increased.

As shown in FIG. 24, the insertion loss vs. frequency characteristics of the surface acoustic wave filter 12 with normal transducers to which the matching circuit shown in FIG. 21B is connected suffer large side lobes outside of the passband. For suppressing such large side lobes, it is necessary to weight the transducers. However, although the side lobes of a surface acoustic wave filter with weighted transducers is suppressed, the surface acoustic wave filter has a widened trap frequency band as indicated by the arrows in FIG. 24.

FIG. 25 shows an interdigitated interdigital surface acoustic wave filter 10 which employs different withdrawal-weighted transducers for suppressing out-band side lobes. As shown in FIG. 25, the interdigitated interdigital surface acoustic wave filter 10 has 13 transducers on a substrate 131. FIG. 26 shows insertion loss vs. frequency characteristics of the surface acoustic wave filter 10 with the matching circuit shown in FIG. 21B being connected thereto. While the side lobes in the insertion loss vs. frequency characteristics shown in FIG. 26 are smaller than those in insertion loss vs. frequency characteristics shown in FIG. 24, the attenuation in the vicinity of the passband is lowered due to a widened trap frequency band.

As shown in FIG. 27, there has also been known an transducer 14 with an increased number of electrode finger pairs on a substrate 141 for use with surface acoustic waves. The impedance of the transducer 14 with many electrode finger pairs exhibits resonant characteristics as shown in FIG. 28. It is known that when the transducer 14 or resonator is inserted in series with a circuit, it provides a stop band at an antiresonant frequency. Since the transducer 14 functions as a capacitive element in the passband, the impedance is low and the loss is small if the capacitance of the capacitive element is large. However, since there is usually a limitation on the capacitance, the impedance is prevented from being reduced as desired, causing an undue loss.

(Two-port surface acoustic wave resonator filter)

As shown in FIG. 29, a conventional two-port surface acoustic wave resonator filter 20 comprises an input transducer 21, two output transducers 22a, 22b disposed one on each side of the input transducer 21 and electrically connected parallel to each other, and two reflectors 23a, 23b disposed outside of the output transducers 22a, 22b, respectively. These transducers are formed on one substrate. FIG. 30 illustrates calculated insertion loss vs. frequency characteristics of the two-port surface acoustic wave resonator filter 20. The insertion loss vs. frequency characteristics shown in FIG. 30 were calculated when the substrate was made of 64y-xLiNbO$_3$, the number of input electrode finger pairs was 18.5, the number of output electrode finger pairs was 12.5, and the aperture length was about 60λ where λ is the wavelength of the input signal.

The two-port surface acoustic wave resonator filter 20 suffers a low insertion loss, and has good attenuation characteristics in a frequency band remote from the passband. However, the two-port surface acoustic wave resonator filter 20 essentially gives rise to a side lobe in a frequency range near and higher than the passband.

To avoid the above difficulty, another conventional two-port surface acoustic wave resonator filter 40 shown in FIG. 31 is composed of the two-port surface acoustic wave resonator filter 20 having the input transducer 21, the output transducers 22a, 22b, and the reflectors 23a, 23b, and another two-port surface acoustic wave resonator filter 30 having an input transducer 31, the output transducers 32a, 32b, and reflectors 33a, 33b that are arranged similarly to the two-port surface acoustic wave resonator filter 20, the two-port surface acoustic wave resonator filters 20, 30 being mounted on one substrate and connected in cascade. The two-port surface acoustic wave resonator filter 40 achieves a large out-band attenuation level.

As shown in FIG. 32, still another conventional two-port surface acoustic wave resonator filter 50 comprises an input transducer 51, an output transducer 52, a reflector 53a disposed outside of the input transducer 51, and a reflector 53b disposed outside of the output transducer 52. These transducers are formed on one substrate. The two-port surface acoustic wave resonator filter 50 has calculated insertion loss vs. frequency characteristics as shown in FIG. 33. As with the two-port surface acoustic wave resonator filter 20, the two-port surface acoustic wave resonator filter 50 has poor attenuation characteristics in a frequency range near and higher than the passband. The insertion loss vs. frequency characteristics shown in FIG. 33 were calculated when the substrate was made of x-112yLiTaO$_3$, the number of input electrode finger pairs was 50, the number of output electrode finger pairs was 50, and the number of reflectors on each side was 100.

The two-port surface acoustic wave resonator filter 40 has an out-band attenuation level which is twice the out-band attenuation level of the two-port surface acoustic wave resonator filter 20, but suffers a doubled insertion loss. If the attenuation level is not sufficient, three or four two-port surface acoustic wave resonator filters are connected in cascade. Therefore, since a two-port surface acoustic wave resonator filter itself is unable to suppress a limited side lobe in a frequency range near and higher than the passband, a plurality of two-port surface acoustic wave resonator filters have to be connected in cascade to suppress such a side lobe. However, the cascaded two-port surface acoustic wave resonator filters undergo an increased insertion loss.

Consequently, although a two-port surface acoustic wave resonator filter has good attenuation characteristics in other frequency ranges than a frequency range near and higher than the passband, other two-port surface acoustic wave resonator filters have to be connected in cascade to the two-port surface acoustic wave resonator filter only to maintain a desired level of attenuation in the frequency range near and higher than the passband.

(Interdigitated interdigital surface acoustic wave filter with a plurality of different withdrawal-weighted transducers)

An interdigitated interdigital surface acoustic wave filter which employs a plurality of different withdrawal-weighted transducers is shown in FIG. 25. As shown in FIG. 25, the interdigitated interdigital surface acoustic wave filter 10 comprises a plurality of different withdrawal-weighted input transducers 11a, 11b, 11c, 11d, 11c, 11b, 11a disposed on a substrate 13 of 36°y-xLiTaO$_3$, and a plurality of different withdrawal-weighted output transducers 12a, 12b, 12c, 12c, 12b, 12a disposed on the substrate 13 between the input transducers. The input transducers 11a, 11b, 11c, 11d, 11c, 11b, 11a are electrically connected parallel to each other and also connected to an input terminal A, and the output transducers 12a, 12b, 12c, 12c, 12b, 12a are electrically connected parallel to each other and also connected to an output terminal B.

The calculated insertion loss vs. frequency characteristics of the interdigitated interdigital surface acoustic wave filter 10 are shown in FIG. 26. When the insertion loss vs. frequency characteristics were calculated, an inductive element is connected as a matching circuit parallel to the interdigitated interdigital surface acoustic wave filter 10. In the illustrated insertion loss vs. frequency characteristics, the level of attenuation in a stop band near and lower than the passband is about 15 dB, and the level of attenuation in a stop band near and higher than the passband is about 25 dB. While the interdigitated interdigital surface acoustic wave filter 10 has a low insertion loss in the passband, the levels of attenuation outside of the passband are not enough. It is also difficult to achieve sharp cutoff characteristics in the insertion loss vs. frequency characteristics.

Improved out-band insertion loss vs. frequency characteristics can be accomplished by interdigitated interdigital surface acoustic wave filters with withdrawal-weighted transducers. However, the trap frequency band as shown in FIG. 26 is widened though the side lobes in the insertion loss vs. frequency characteristics are suppressed.

A filter composed of surface acoustic wave resonators 54~58 connected in a ladder configuration as shown in FIG.

34 has insertion loss vs. frequency characteristics as shown in FIG. 35. Such a ladder-type filter arrangement requires that the product of the admittance of the surface acoustic wave resonators 55, 57 connected parallel to each other and the impedance of the surface acoustic wave resonators 54, 56, 58 connected in series to each other be 1 or more outside of the passband. Thus, the surface acoustic wave resonators 54, 56, 58 connected in series to each other and the surface acoustic wave resonators 55, 57 connected parallel to each other have to be related to each other in a certain manner.

As described above, if the transducers of the conventional interdigitated interdigital surface acoustic wave filters are withdrawal-weighted in order to suppress the side lobes, then the trap frequency band is increased, impairing the cutoff characteristics in the insertion loss vs. frequency characteristics.

It has been customary to connect interdigitated interdigital surface acoustic wave filters in cascade for increasing the level of attenuation in stop bands. This approach is effective to increase the out-band attenuation levels, but also suffers an increased insertion loss in the passband.

Filters composed of surface acoustic wave resonators connected in a ladder configuration require that a certain relationship be achieved between those surface acoustic wave resonators which are connected in series to each other and those surface acoustic wave resonators which are connected parallel to each other. As a result, the levels of attenuation in the stop bands remote from the passband are low, and there are certain limitations imposed on the passband and notch frequency. Higher attenuation levels outside of the passband sacrifice the insertion loss, i.e., cause an increase in the insertion loss.

SUMMARY OF THE INVENTION

It is a first object of the present invention to provide a surface acoustic wave filter which allows impedance matching to be achieved easily even if the number of transducers is increased for a lower insertion loss, and which has better out-band insertion loss vs. frequency characteristics.

A second object of the present invention is to provide a surface acoustic wave filter which is of a simple arrangement for lowering the level of a side lobe in a frequency range close to and higher than a passband, which side lobe is essentially developed by a two-port surface acoustic wave resonator filter.

A third object of the present invention is to provide a composite surface acoustic wave filter which is free of limitations on the passband and notch frequency, has a lower insertion loss, and better insertion loss vs. frequency characteristics by increasing the levels of attenuation in frequency ranges higher and lower than the passband with the use of surface acoustic wave resonators.

A fourth object of the present invention is to provide a mobile communication system which incorporates a composite surface acoustic wave filter of better insertion loss vs. frequency characteristics with surface acoustic wave resonators.

To achieve the first object of the present invention, there is provided a composite surface acoustic wave filter comprising a surface acoustic wave filter having input and output terminals, and at least one surface acoustic wave resonator electrically connected in series to at least one of the input and output terminals of the surface acoustic wave filter. The surface acoustic wave resonator may have an antiresonant frequency in a stop band which is close to and higher than a passband of the surface acoustic wave filter. The surface acoustic wave filter may comprise an interdigitated interdigital surface acoustic wave filter comprising a plurality of input transducers electrically connected in parallel to each other, and a plurality of output transducers disposed between the input transducers and electrically connected in parallel to each other. Alternatively, the surface acoustic wave filter may comprise a two-port surface acoustic wave resonator filter. The surface acoustic wave resonator may comprise a one-port surface acoustic wave resonator. The surface acoustic wave filter and the surface acoustic wave resonator may be mounted on a substrate.

To achieve the second object of the present invention, there is provided a composite surface acoustic wave filter comprising a surface acoustic wave filter having input and output terminals, and at least one surface acoustic wave resonator electrically connected parallel to at least one of the input and output terminals of the surface acoustic wave filter. The surface acoustic wave resonator may have a resonant frequency in a stop band which is close to and lower than a passband of the surface acoustic wave filter. The surface acoustic wave filter may comprise an interdigitated interdigital surface acoustic wave filter comprising a plurality of input transducers electrically connected parallel to each other, and a plurality of output transducers disposed between the input transducers and electrically connected parallel to each other. Alternatively, the surface acoustic wave filter may comprise a two-port surface acoustic wave resonator filter. The surface acoustic wave resonator may comprise a one-port surface acoustic wave resonator. The surface acoustic wave filter and the surface acoustic wave resonator may be mounted on the substrate.

To achieve the third object of the present invention, there is provided a composite surface acoustic wave filter comprising a surface acoustic wave filter having input and output terminals, at least one first surface acoustic wave resonator electrically connected parallel to at least one of the input and output terminals of the surface acoustic wave filter, and at least one second surface acoustic wave resonator electrically connected in series to the surface acoustic wave filter. The first surface acoustic wave resonator may have a resonant frequency in a stop band which is close to and lower than a passband of the surface acoustic wave filter, and the second surface acoustic wave resonator may have an antiresonant frequency in a stop band which is close to and higher than the passband of the surface acoustic wave filter. The surface acoustic wave filter may comprise an interdigitated interdigital surface acoustic wave filter comprising a plurality of input transducers electrically connected parallel to each other, and a plurality of output transducers disposed between the input transducers and electrically connected parallel to each other. Alternatively, the surface acoustic wave filter may comprise a two-port surface acoustic wave resonator filter. Each of the first and second surface acoustic wave resonators may comprise a one-port surface acoustic wave resonator. The surface acoustic wave filter and the first and second surface acoustic wave resonators may be mounted on the substrate.

To achieve the fourth object of the present invention, there is provided a mobile communication system including filters in an antenna sharing unit and interstage filters, each of the filters and the interstage filters comprising any one of the composite acoustic surface wave filters described above.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

1st Embodiment

Figure 1:
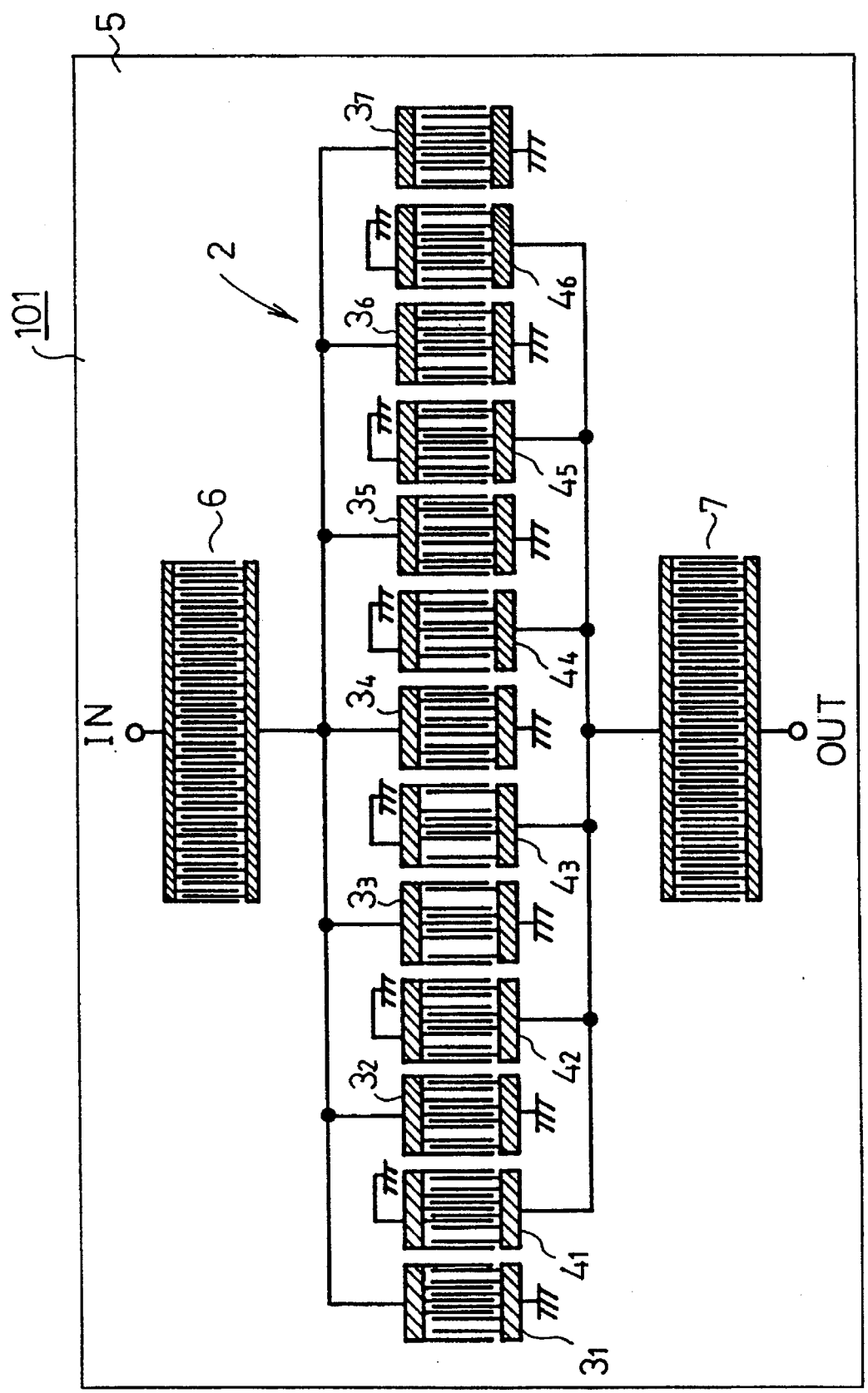
FIG. 1 is a schematic plan view of an interdigitated interdigital surface acoustic wave filter according to a first embodiment of the present invention.

As shown in FIG. 1, an interdigitated interdigital surface acoustic wave filter 101 according to a first embodiment of the present invention comprises an interdigitated interdigital surface acoustic wave filter 2 mounted on a substrate 5. The interdigitated interdigital surface acoustic wave filter 2 has 13 different withdrawal-weighted transducers including input transducers $3_1$~$3_7$ and output transducers $4_1$~$4_6$.

The interdigitated interdigital surface acoustic wave filter 101 also includes a pair of transducers 6, 7 mounted on the substrate 5 and connected respectively to input and output terminals of the interdigitated interdigital surface acoustic wave filter 2. The transducers 6, 7 have many electrode finger pairs and are used in notch filters as resonators of the same structure.

Figure 2:
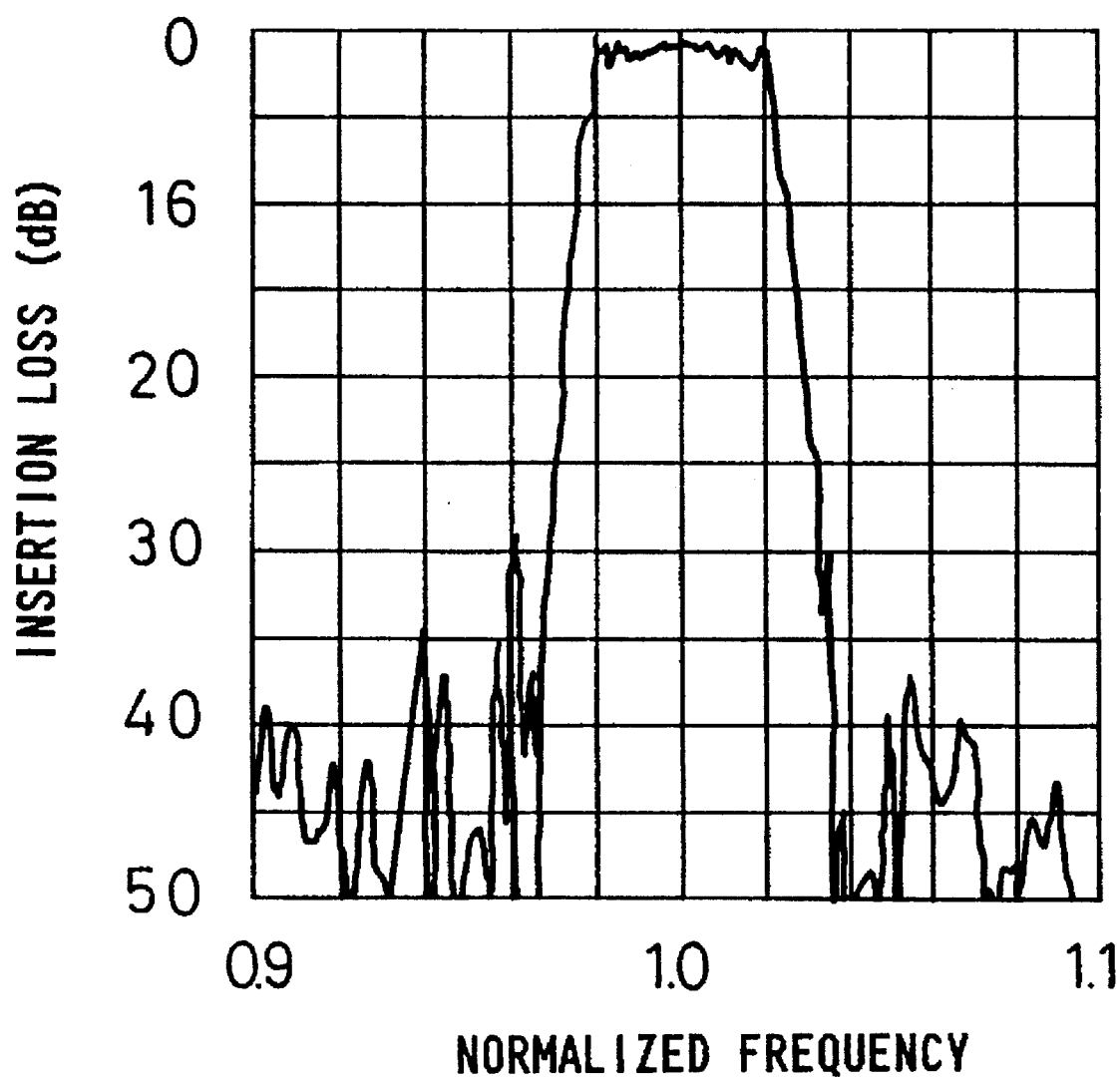
FIG. 2 is a diagram showing insertion loss vs. frequency characteristics of the interdigitated interdigital surface acoustic wave filter according to the first embodiment.
Figure 21A:
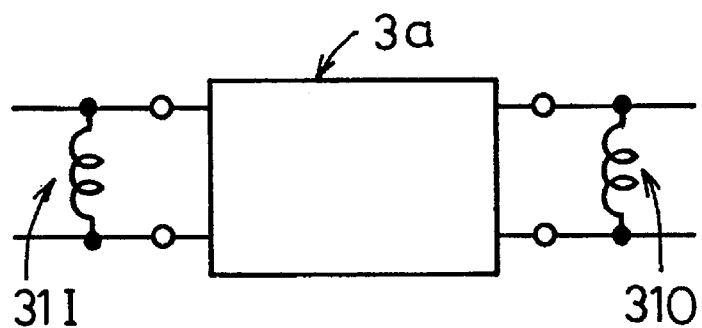
FIG. 21A is a circuit diagram of a matching circuit for the interdigitated interdigital surface acoustic wave filter shown in FIG. 19.
Figure 24:
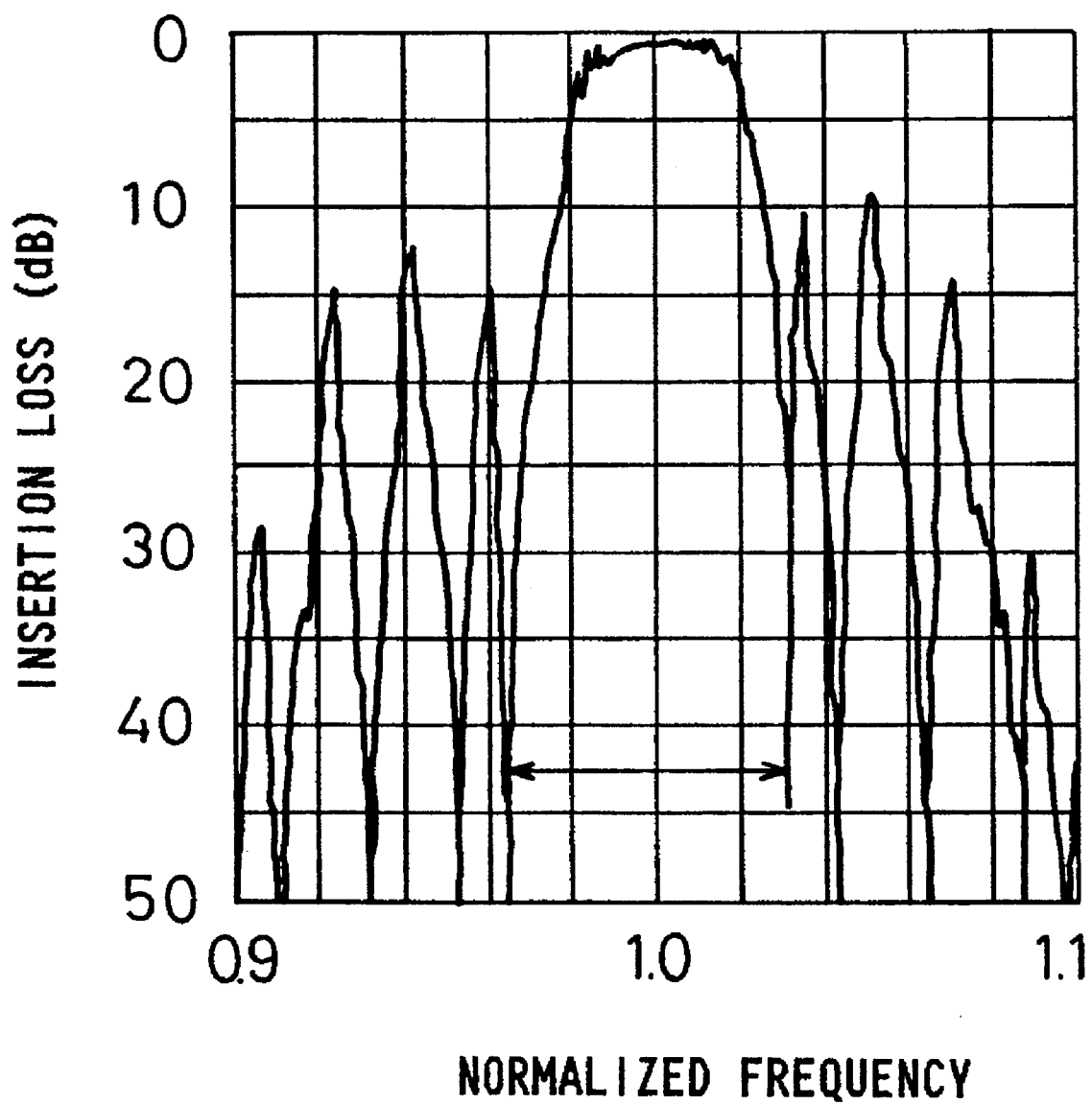
FIG. 24 is a diagram showing insertion loss vs. frequency characteristics of the interdigitated interdigital surface acoustic wave filter shown in FIG. 22 which is combined with the matching circuit shown in FIG. 21B.
Figure 25:
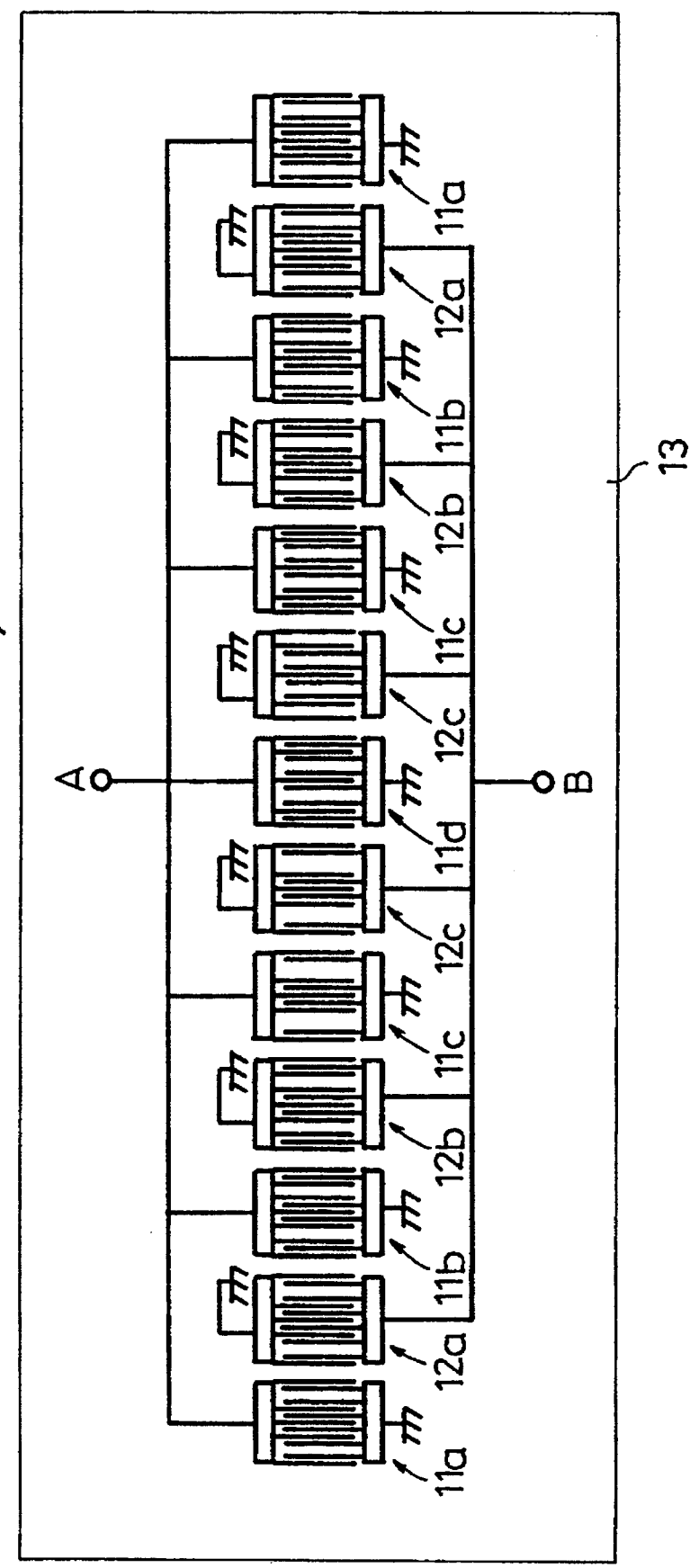
FIG. 25 is a schematic plan view of a conventional interdigitated interdigital surface acoustic wave filter with 13 different withdrawal-weighted transducers.

FIG. 2 shows insertion loss vs. frequency characteristics of the interdigitated interdigital surface acoustic wave filter 101 with matching circuits shown in FIG. 21A being connected to the respective input and output terminals thereof. Comparison between the insertion loss vs. frequency characteristics shown in FIG. 2 and those shown in FIGS. 24 and 26 clearly indicates that the interdigitated interdigital surface acoustic wave filter 101 has reduced side lobes outside of the passband and improved attenuation characteristics.

The transducers 6, 7 have a low impedance at resonant frequencies thereof and a high impedance at antiresonant frequencies thereof, and operate as capacitive elements at other frequencies. In the first embodiment, the antiresonant frequencies of the transducers 6, 7 are selected to be in the vicinity of the passband thereby to improve attenuation characteristics which are lowered by the withdrawal weighting of the electrode fingers of the interdigitated interdigital surface acoustic wave filter 2, and the transducers 6, 7 serve simply as capacitive elements in the passband. Therefore, the interdigitated interdigital surface acoustic wave filter 101 does not require the series capacitance of a matching circuit which is necessitated by increasing the number of transducers for a lower insertion loss. If the notch filters were composed of the transducers 6, 7 only, the capacitance of the resonators would be required to be increased infinitely for reducing the insertion loss. According to the first embodiment, however, there is a finite optimum capacitance value determined in relation to the interdigitated interdigital surface acoustic wave filter, which is effective to reduce the insertion loss.

Figure 21B:
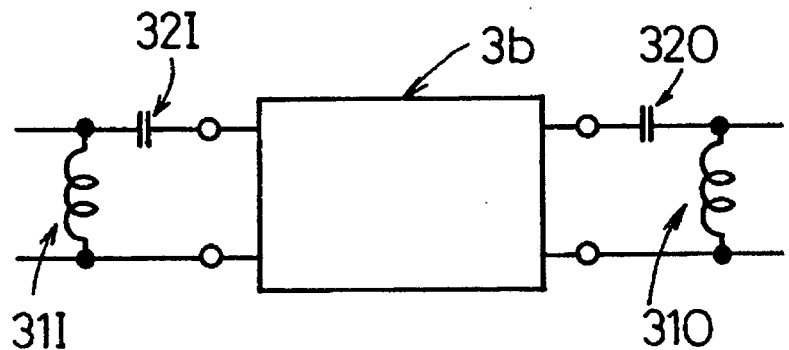
FIG. 21B is a circuit diagram of a matching circuit for an interdigitated interdigital surface acoustic wave filter shown in FIG. 22.
Figure 22:
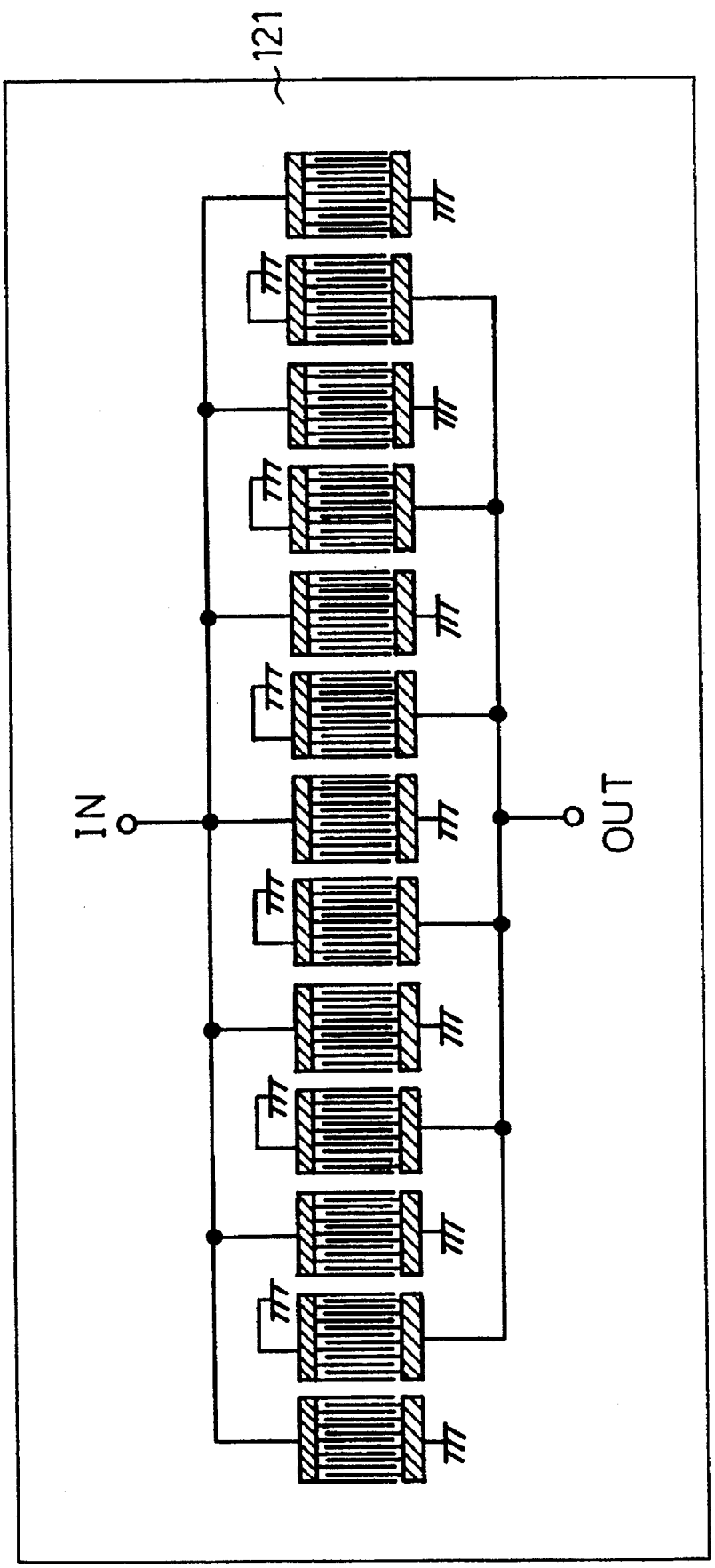
FIG. 22 is a schematic plan view of a conventional interdigitated interdigital surface acoustic wave filter with 13 transducers.
Figure 23A:
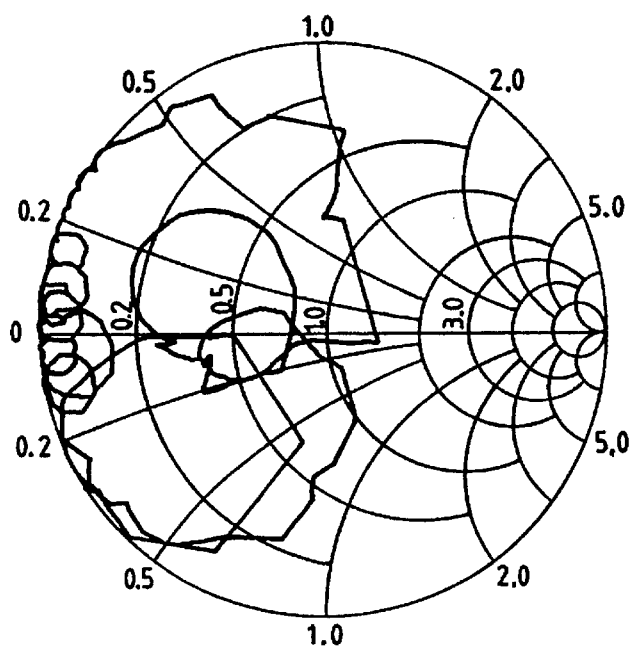
FIG. 23A is a diagram showing calculated impedances on input transducers of the interdigitated interdigital surface acoustic wave filter shown in FIG. 22.
Figure 23B:
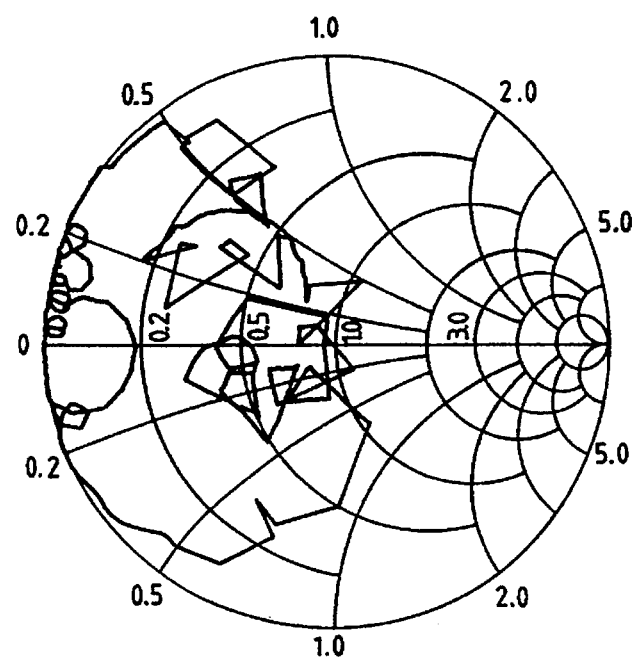
FIG. 23B is a diagram showing calculated impedances on output transducers of the interdigitated interdigital surface acoustic wave filter shown in FIG. 22.
Figure 26:
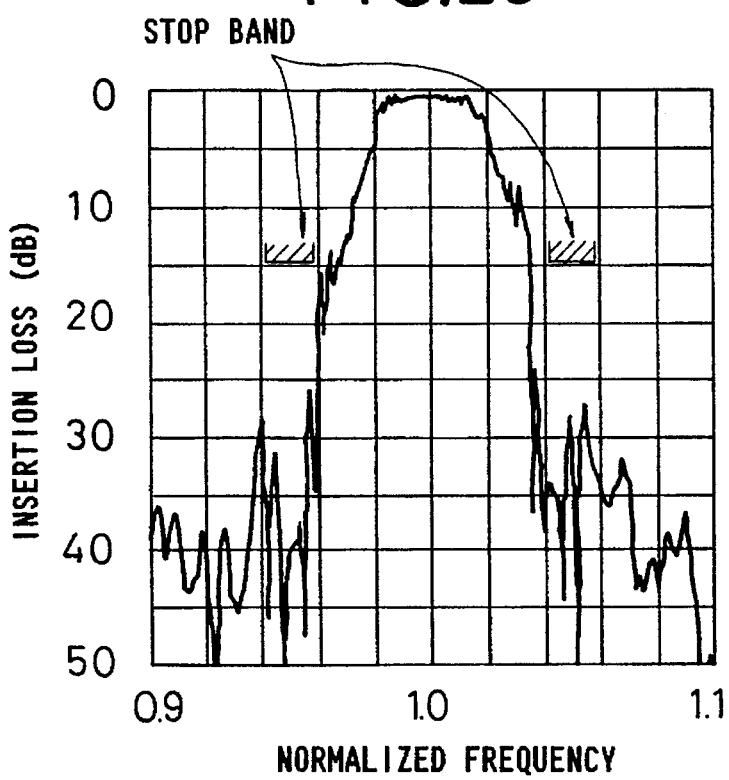
FIG. 26 is a diagram showing insertion loss vs. frequency characteristics of the interdigitated interdigital surface acoustic wave filter shown in FIG. 25 which is combined with the matching circuit shown in FIG. 21B.
Figure 27:
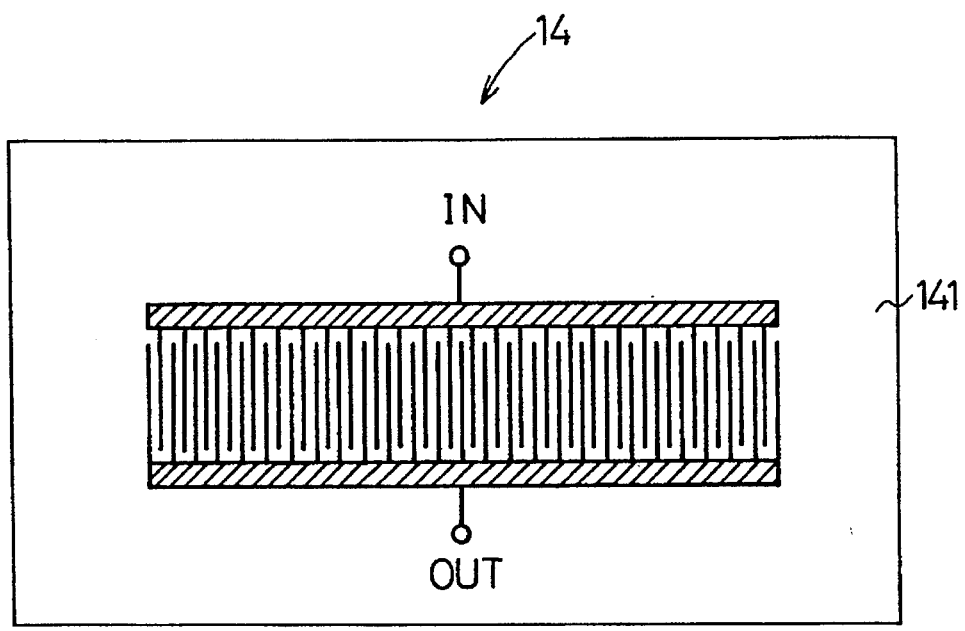
FIG. 27 is a schematic plan view of a conventional transducer with an increased number of electrode finger pairs.
Figure 28:
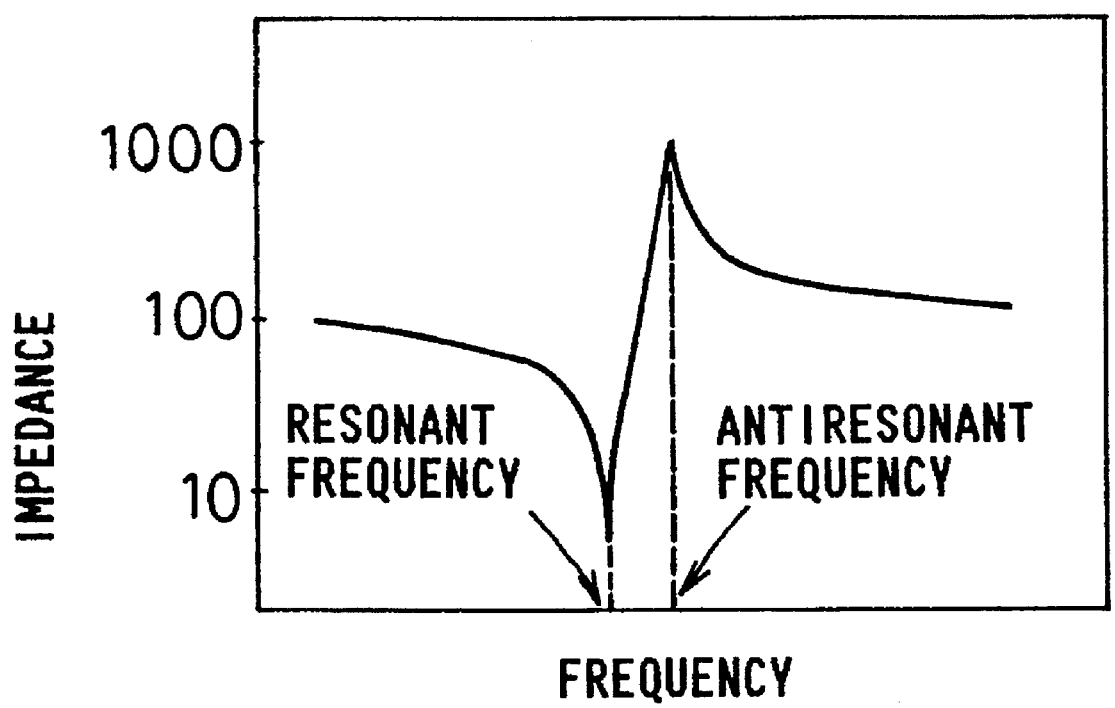
FIG. 28 is a diagram showing impedance vs. frequency characteristics of the transducer shown in FIG. 27.

Heretofore, as shown in FIG. 21B, a matching circuit is required to be composed of two capacitive elements and two inductive elements, and the attenuation in the vicinity of the passband in the insertion loss vs. frequency characteristics is low as shown in FIG. 26. In this embodiment, however, a matching circuit may be composed of two inductive elements, and the insertion loss vs. frequency characteristics are better as shown in FIG. 2.

A resonator comprising reflectors disposed one on each side of each of the transducers 6, 7 shown in FIG. 1 offers the same advantages as described above.

2nd Embodiment

Figure 3:
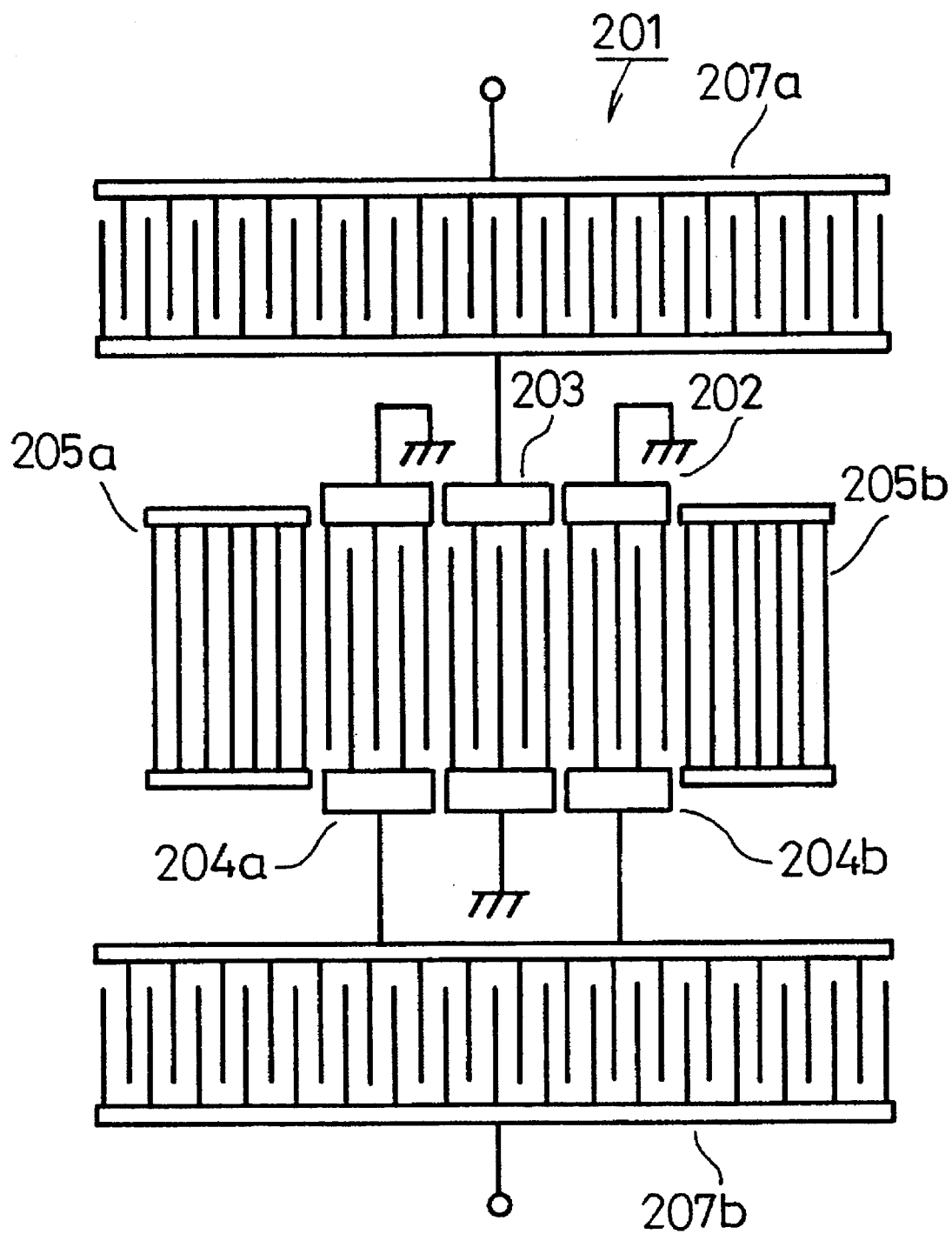
FIG. 3 is a schematic plan view of a surface acoustic wave filter according to a second embodiment of the present invention.

FIG. 3 shows a surface acoustic wave filter according to a second embodiment of the present invention.

The surface acoustic wave filter, generally designated by the reference numeral 201 in FIG. 3, comprises a two-port surface acoustic wave resonator filter 202 comprising an input transducer 203, two output transducers 204a, 204b disposed one on each side of the input transducer 203, a reflector 205a disposed outside of the output transducer 204a, and a reflector 205b disposed outside of the output transducer 204b, a one-port surface acoustic wave resonator 207a disposed on an input terminal side of the two-port surface acoustic wave resonator filter 202, and a one-port surface acoustic wave resonator 207b disposed on an output terminal side of the two-port surface acoustic wave resonator filter 202. The one-port surface acoustic wave resonator 207a is electrically connected in series to an input terminal of the two-port surface acoustic wave resonator filter 202, so that an input signal can be supplied through the one-port surface acoustic wave resonator 207a to the input terminal of the two-port surface acoustic wave resonator filter 202. The one-port surface acoustic wave resonator 207b is electrically connected in series to output terminals of the output transducers 204a, 204b of the two-port surface acoustic wave resonator filter 202, so that an output signal can be outputted through the one-port surface acoustic wave resonator 207b. The two-port surface acoustic wave resonator filter 202 and the one-port surface acoustic wave resonators 207a, 207b are formed on one substrate.

Figure 4:
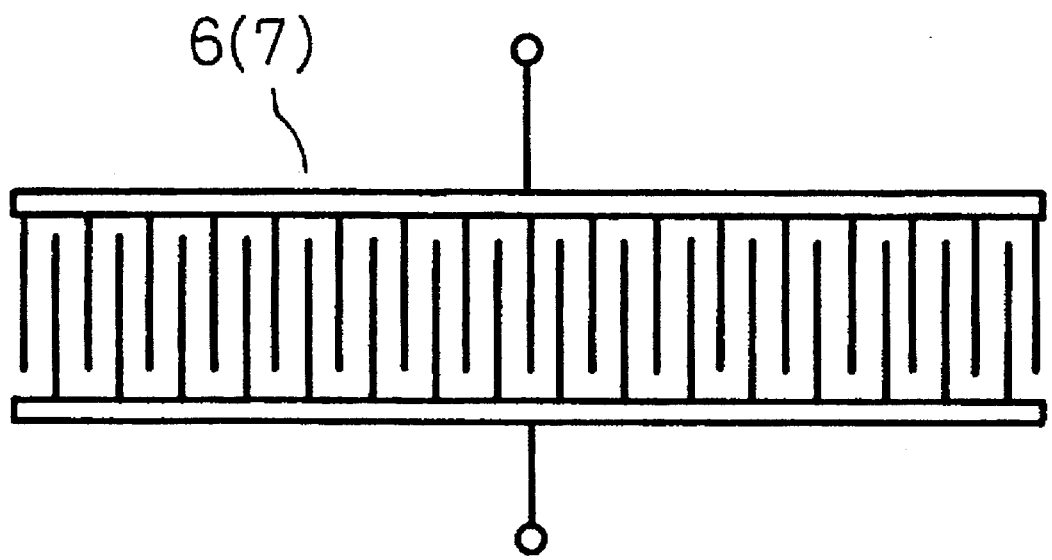
FIG. 4 is a schematic plan view of a one-port surface acoustic wave resonator incorporated in the surface acoustic wave filter according to the second embodiment.
Figure 5:
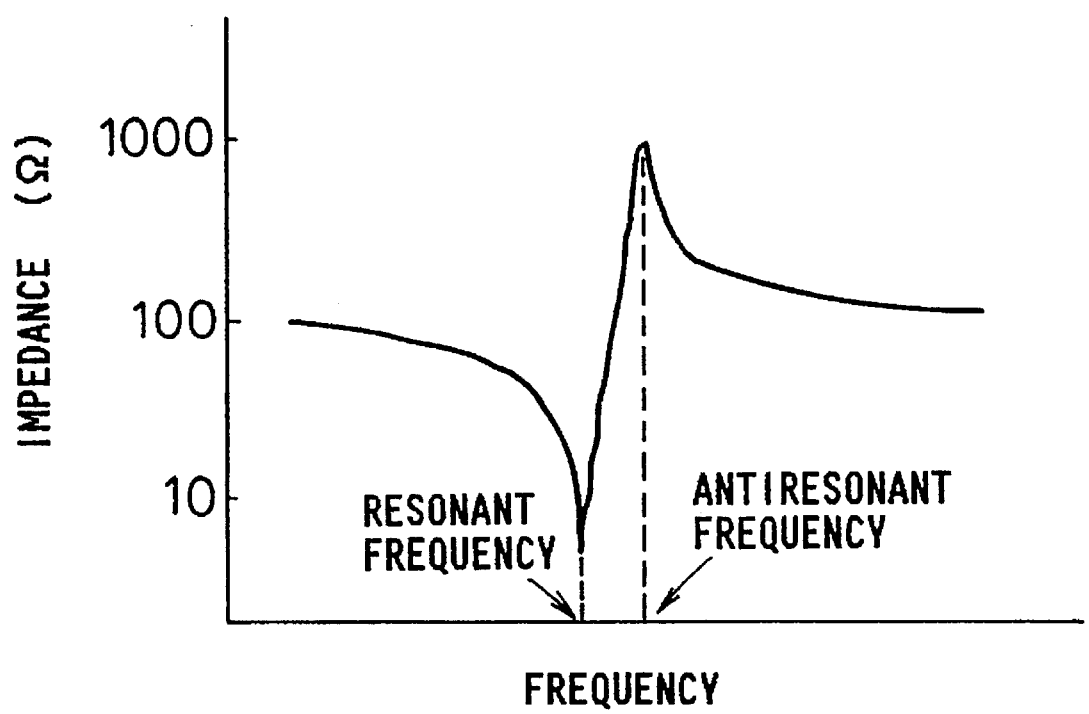
FIG. 5 is a diagram showing the input impedance of the one-port surface acoustic wave resonator in the second embodiment.

The input impedance of a one-port surface acoustic wave resonator 6 (7) shown in FIG. 4, which is equivalent to the transducer 6 or 7 shown in FIG. 1 or the one-port surface acoustic wave resonator 207a or 207b, exhibits resonant characteristics shown in FIG. 5. The one-port surface acoustic wave resonators 207a, 207b of such resonant characteristics, when electrically connected in series to the two-port surface acoustic wave resonator filter 202, provide a stop band in the vicinity of their antiresonant frequencies.

The one-port surface acoustic wave resonators 207a, 207b have respective antiresonant frequencies as respective normalized frequencies fa, fb (see FIG. 6) that are close to and higher than the passband of the two-port surface acoustic wave resonator filter 202.

Figure 30:
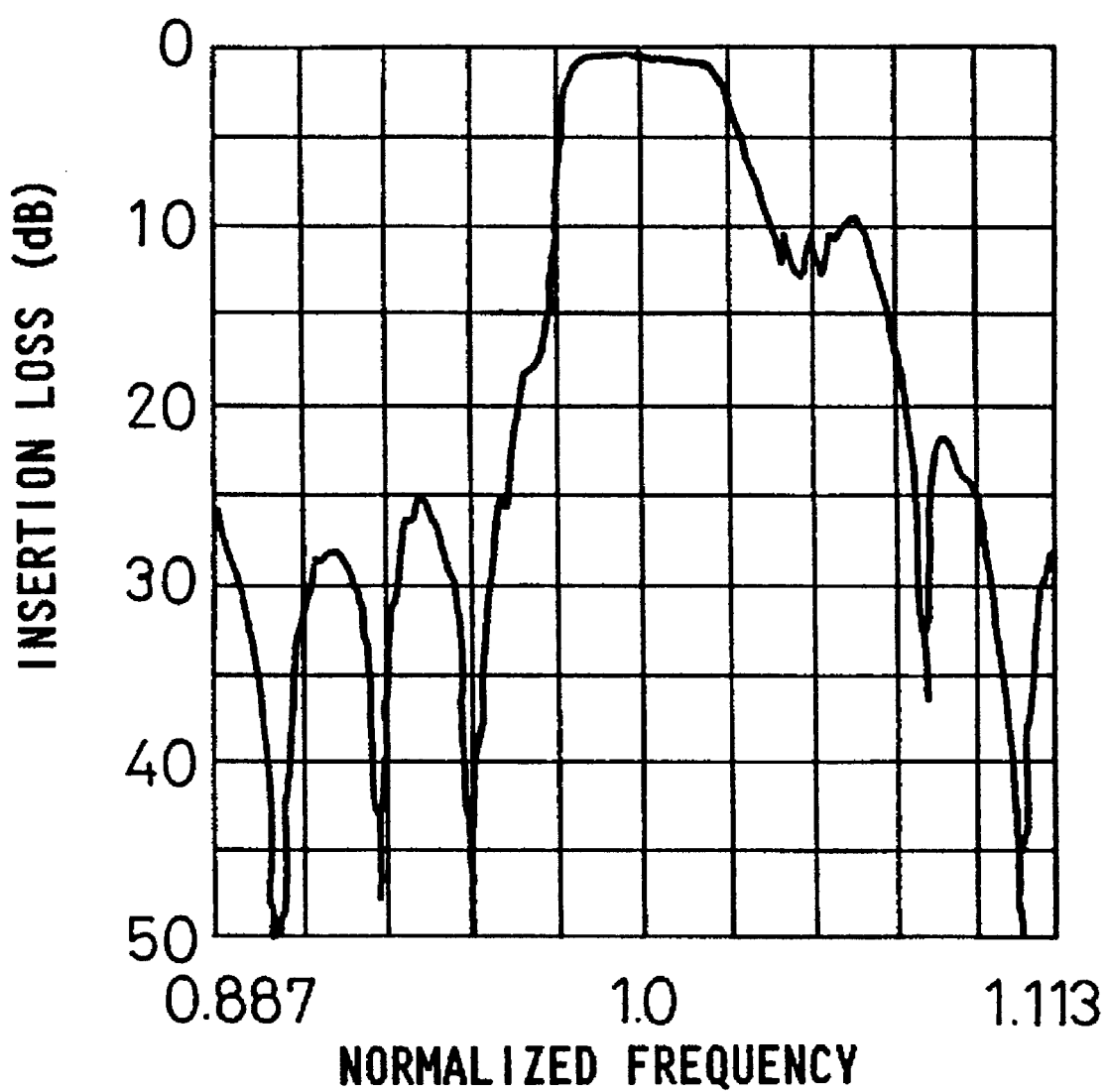
FIG. 30 is a diagram showing insertion loss vs. frequency characteristics of the two-port surface acoustic wave resonator filter shown in FIG. 29.
Figure 31:
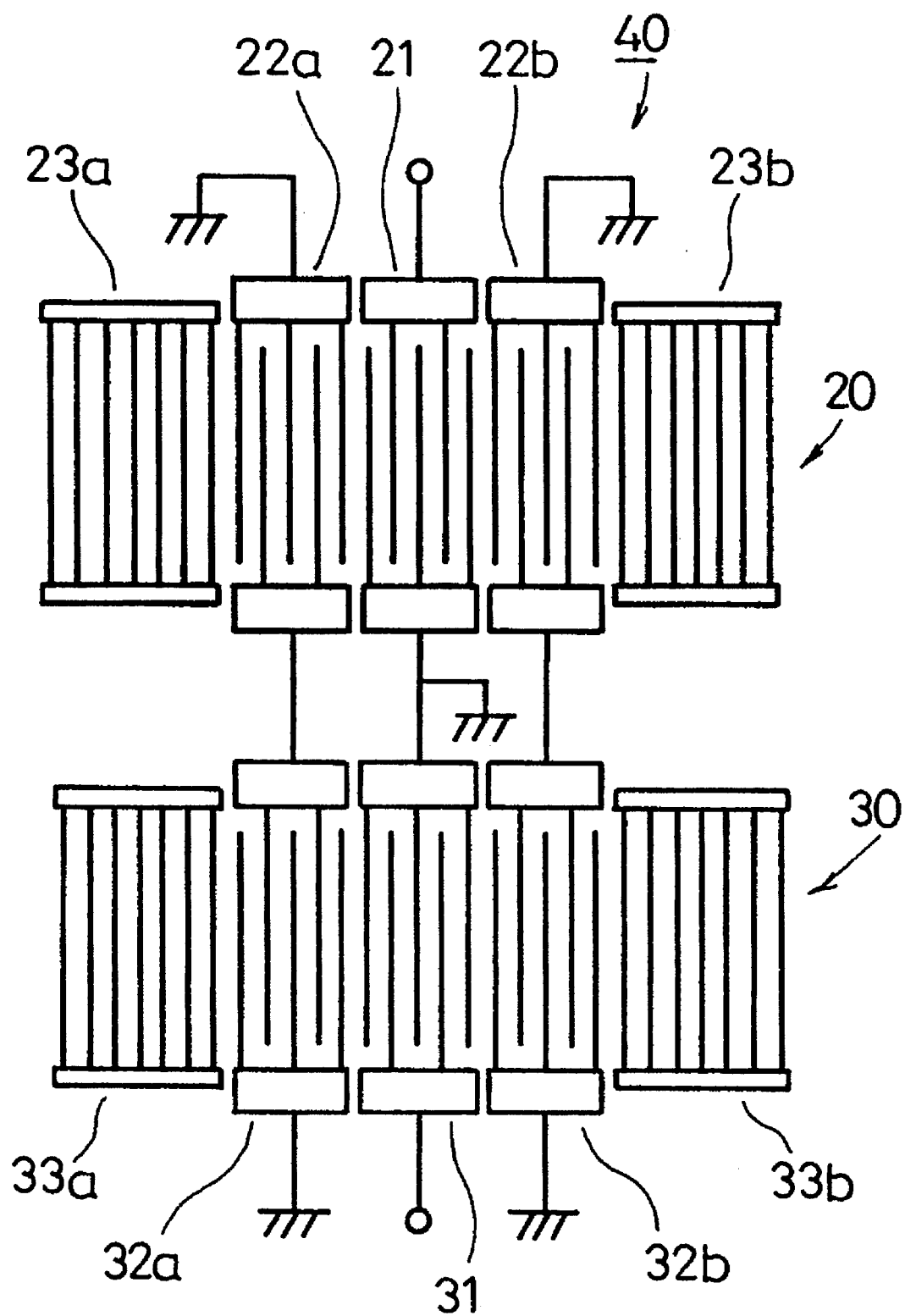
FIG. 31 is a schematic plan view of two cascaded two-port surface acoustic wave resonator filters shown in FIG. 29.

Therefore, while the two-port surface acoustic wave resonator filter 202 has insertion loss vs. frequency characteristics equal to the insertion loss vs. frequency characteristics shown in FIG. 30, the antiresonant frequencies of the one-port surface acoustic wave resonators 207a, 207b are selected as respective normalized frequencies fa, fb. Consequently, the level of a side lobe produced in a range close to and higher than the passband of the two-port surface acoustic wave resonator filter 202 is greatly reduced. The surface acoustic wave filter 201 according to the second embodiment thus has insertion loss vs. frequency characteristics as shown in FIG. 6, and any increase in its insertion loss is almost eliminated.

Since the one-port surface acoustic wave resonators 207a, 207b are connected in cascade to the input and output terminals, respectively, of the two-port surface acoustic wave resonator filter 202, the level of the side lobe which is produced in a range close to and higher than the passband of the conventional two-port surface acoustic wave resonator filter 20 is lowered in its full range, thereby providing sufficient attenuation characteristics.

The one-port surface acoustic wave resonators 207a, 207b function as electrostatic capacitors at frequencies other than their resonant and antiresonant frequencies, and their electrostatic capacitances are selected to be of a relatively large value. This makes it possible to prevent the impedance of the two-port surface acoustic wave resonator filter 202 from varying in its passband. Setting the electrostatic capacitances to suitable values is equivalent to electrically connecting electrostatic capacitive elements in series to the two-port surface acoustic wave resonator filter 202 in the passband thereof. Thus, these one-port surface acoustic wave resonators 207a, 207b may be used as matching circuit elements. The two-port surface acoustic wave resonator filter 202 can therefore be designed with greater freedom.

Figure 6:
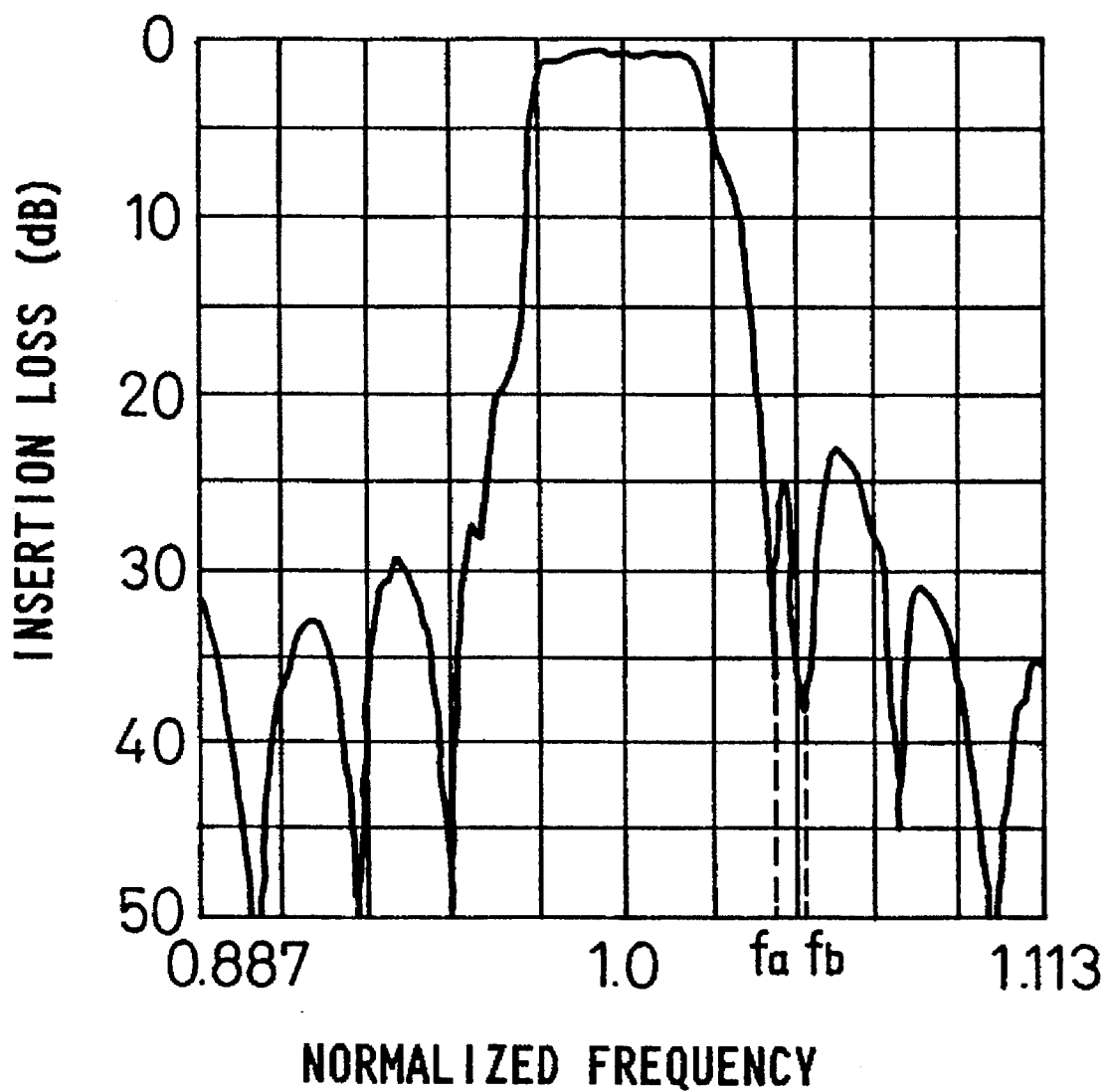
FIG. 6 is a diagram showing insertion loss vs. frequency characteristics of the surface acoustic wave filter according to the second embodiment.
Figure 29:
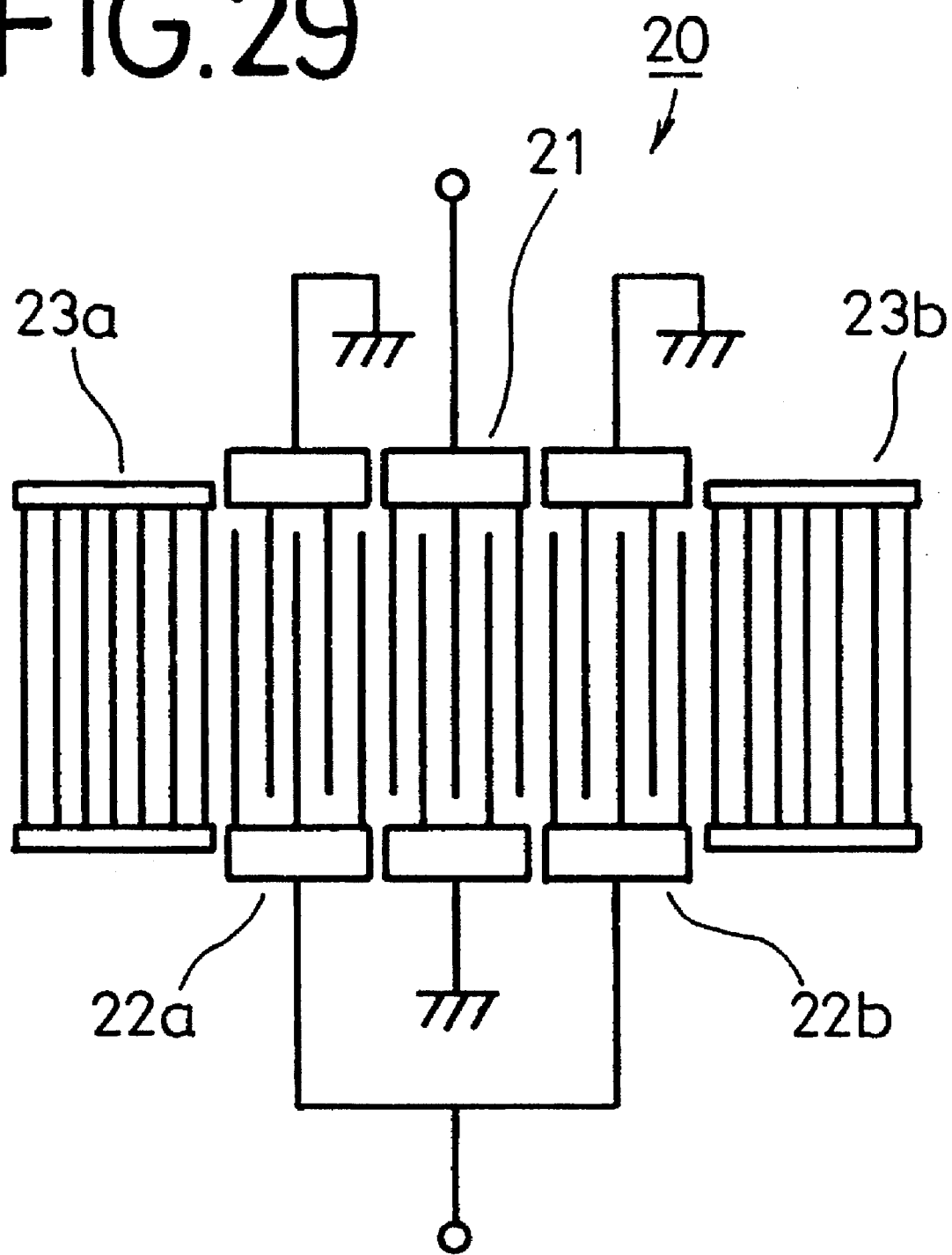
FIG. 29 is a schematic plan view of a conventional two-port surface acoustic wave resonator filter.

The insertion loss vs. frequency characteristics shown in FIG. 6 can also be obtained by connecting the one-port surface acoustic wave resonators 207a, 207b to the two-port surface acoustic wave resonator filter 20 shown in FIG. 29 which was designed without a matching circuit in a 50 Ω-impedance arrangement.

3rd Embodiment

Figure 7:
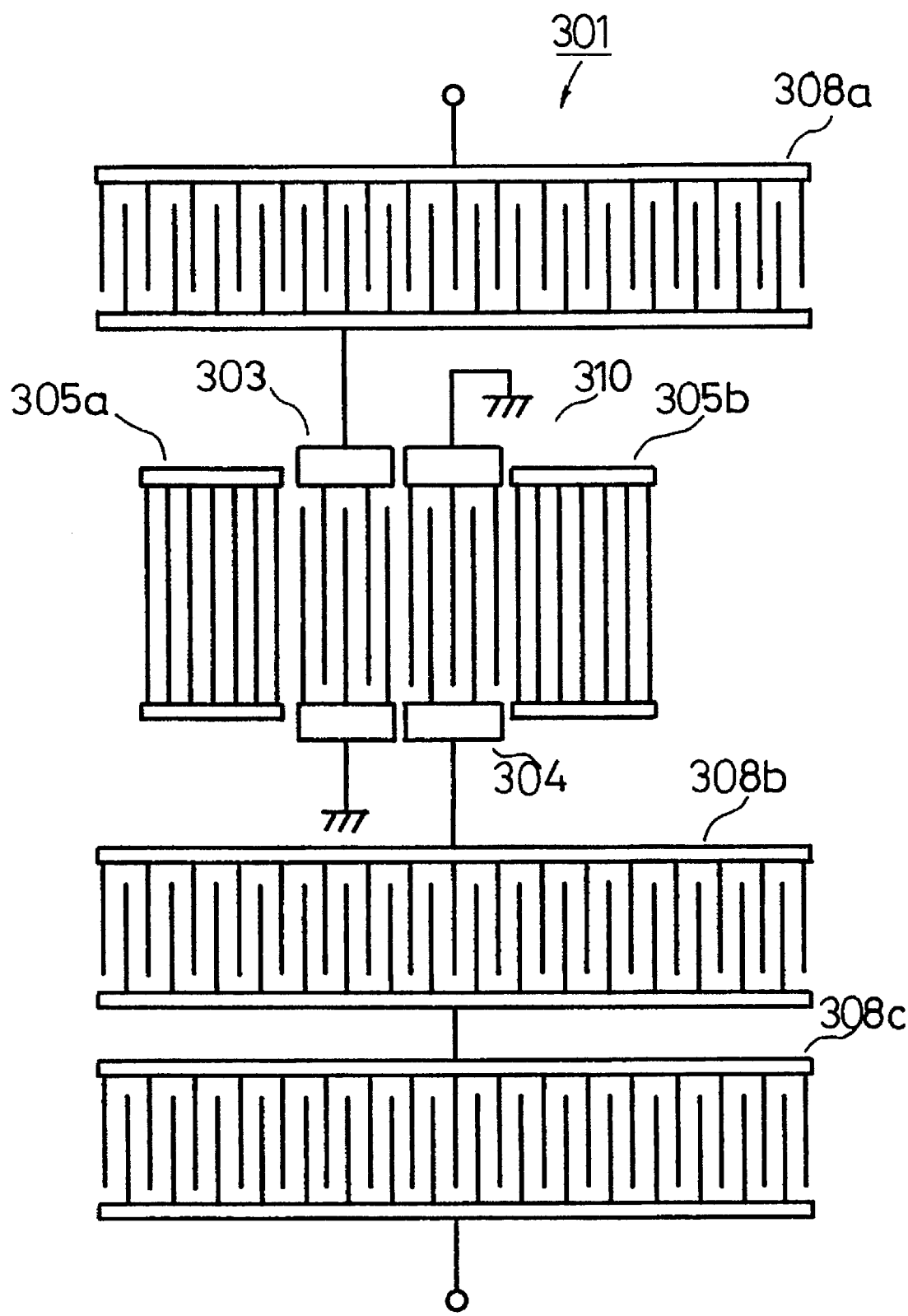
FIG. 7 is a schematic plan view of a surface acoustic wave filter according to a third embodiment of the present invention.

FIG. 7 illustrates a surface acoustic wave filter according to a third embodiment of the present invention.

As shown in FIG. 7, the surface acoustic wave filter, generally designated by the reference numeral 301, comprises a two-port surface acoustic wave resonator filter 310 comprising an input transducer 303, an output transducer 304, a reflector 305a disposed outside of the input transducer 303, and a reflector 305b disposed outside of the output transducer 304, a one-port surface acoustic wave resonator 308a electrically connected in series to an input terminal of the two-port surface acoustic wave resonator filter 310 for supplying an input signal through the one-port surface acoustic wave resonator 308a to the two-port surface acoustic wave resonator filter 310, a one-port surface acoustic wave resonator 308b electrically connected in series to an output terminal of the two-port surface acoustic wave resonator filter 310, and a one-port surface acoustic wave resonator 308c electrically connected in series to an output terminal of the one-port surface acoustic wave resonator 308b for outputting an output signal through the one-port surface acoustic wave resonator 308c. The two-port surface acoustic wave resonator filter 310 and the one-port surface acoustic wave resonators 308a, 308b, 308c are formed on one substrate.

The one-port surface acoustic wave resonators 308a, 308b, 308c have respective antiresonant frequencies as respective normalized frequencies fa, fb, fc (see FIG. 8) that are close to and higher than the passband of the two-port surface acoustic wave resonator filter 310.

Figure 8:
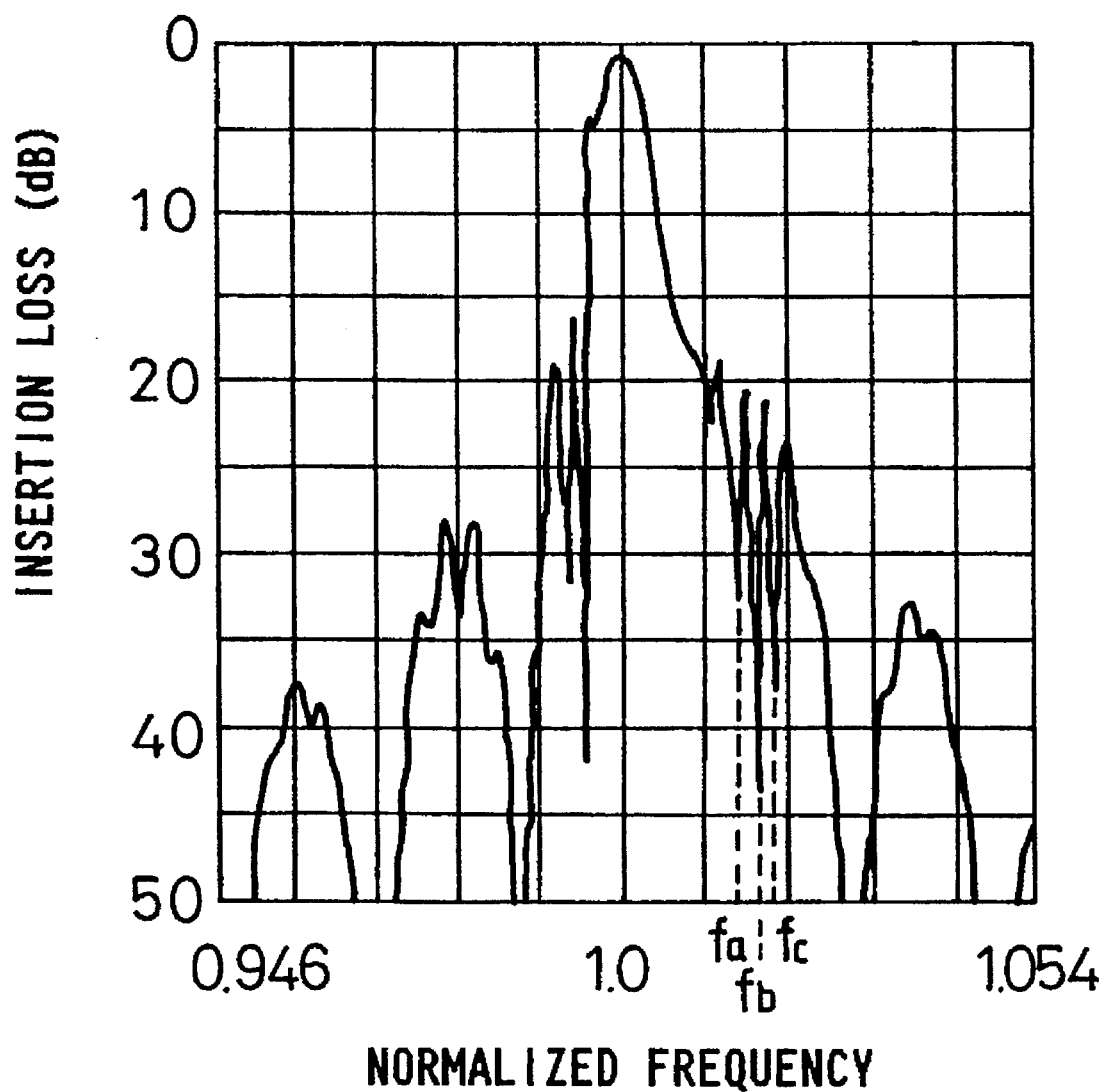
FIG. 8 is a diagram showing insertion loss vs. frequency characteristics of the surface acoustic wave filter according to the third embodiment.
Figure 32:
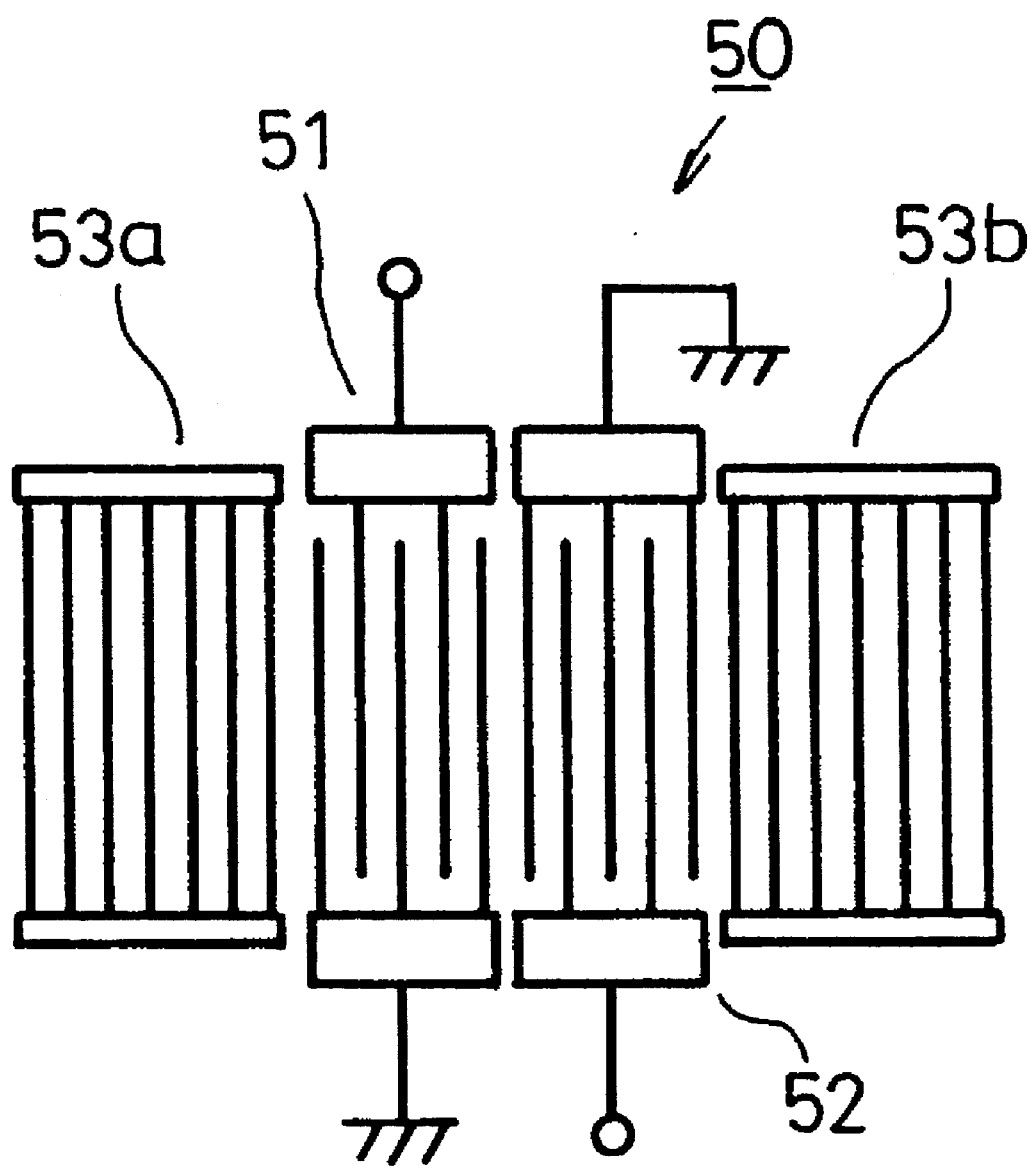
FIG. 32 is a schematic plan view of another conventional two-port surface acoustic wave resonator filter.
Figure 33:
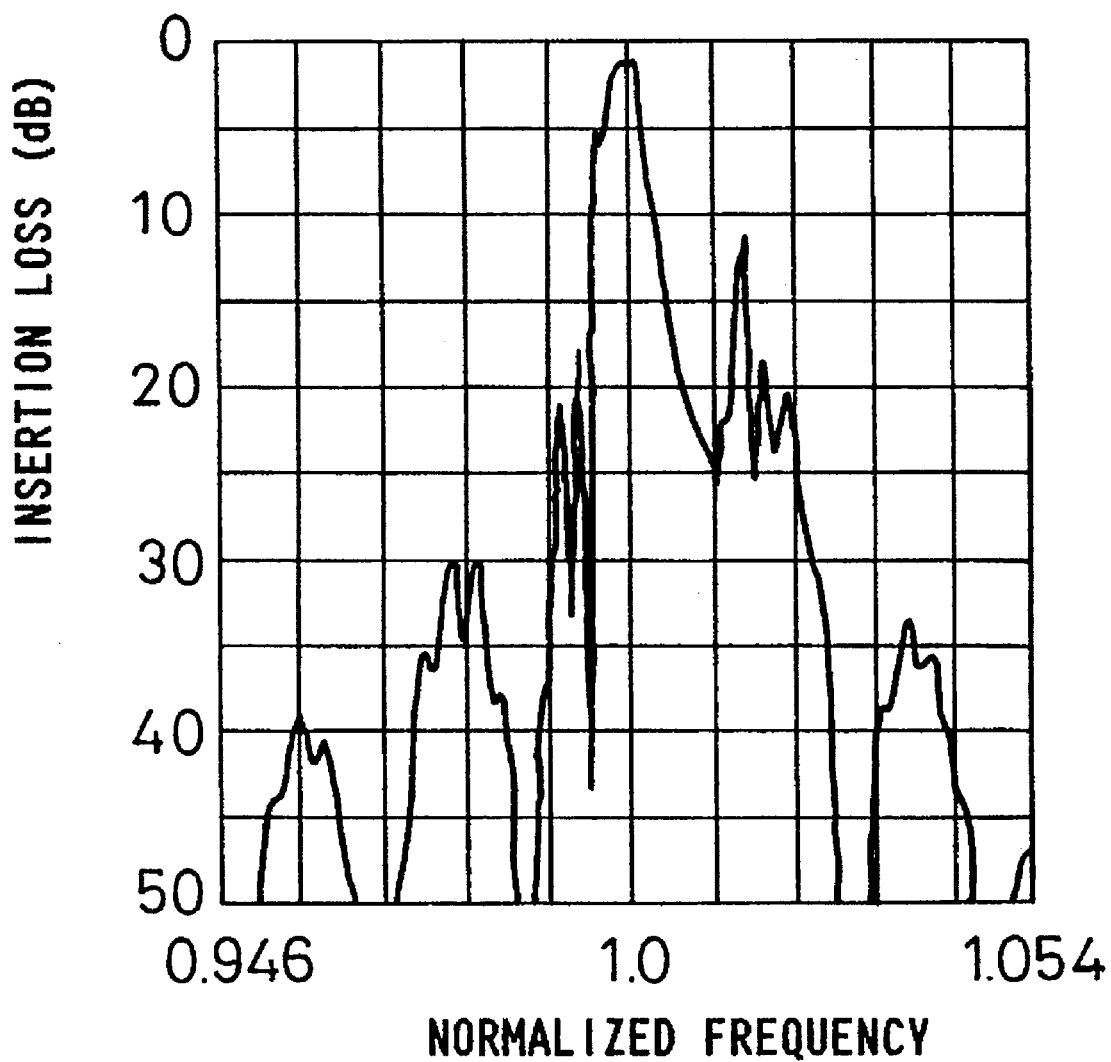
FIG. 33 is a diagram showing insertion loss vs. frequency characteristics of the two-port surface acoustic wave resonator filter shown in FIG. 32.
Figure 34:
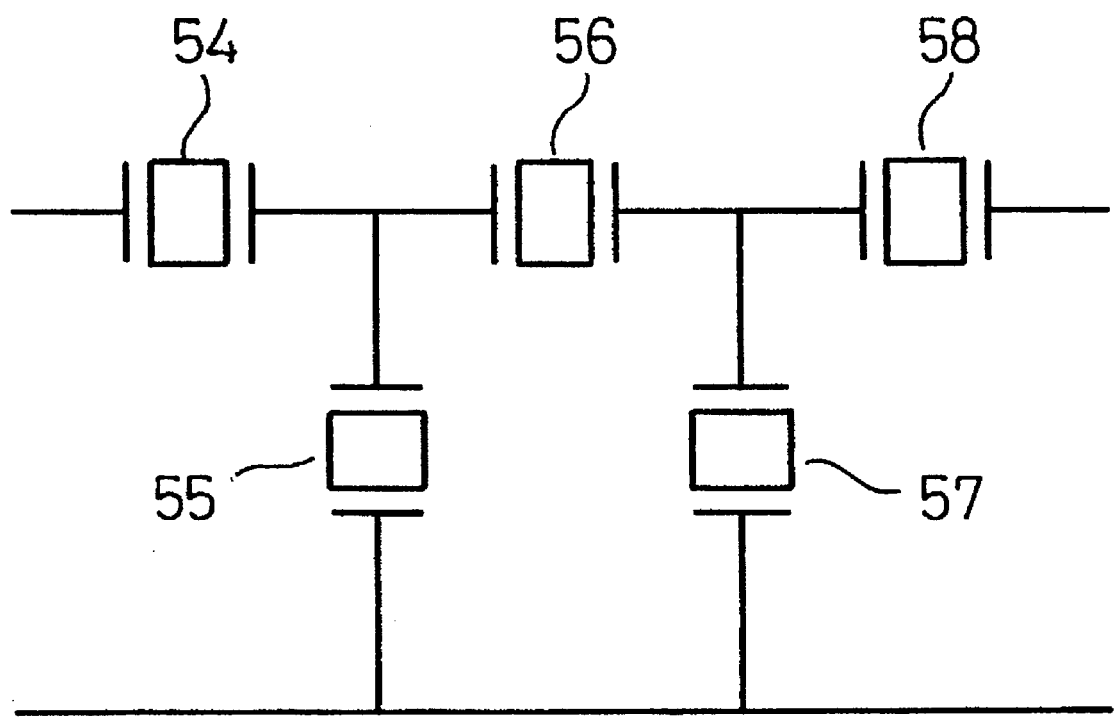
FIG. 34 is a diagram of a conventional filter composed of surface acoustic wave resonators connected in a ladder configuration.
Figure 35:
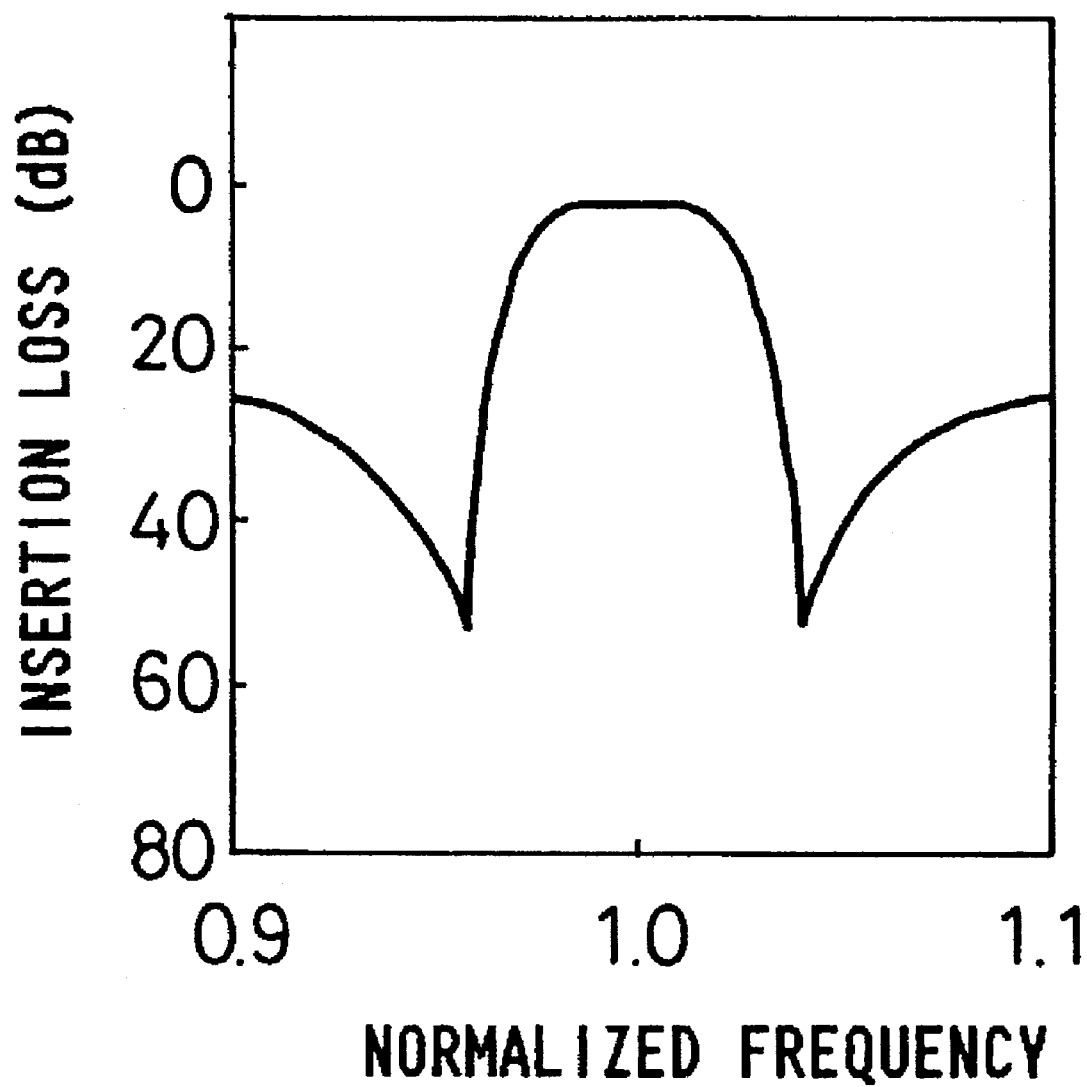
FIG. 35 is a diagram showing insertion loss vs. frequency characteristics of the filter shown in FIG. 34.

Therefore, while the two-port surface acoustic wave resonator filter 310 is the same as the two-port surface acoustic wave resonator filter 50 shown in FIG. 32 and has insertion loss vs. frequency characteristics equal to the insertion loss vs. frequency characteristics shown in FIG. 33, the antiresonant frequencies of the one-port surface acoustic wave resonators 308a, 308b, 308c are selected as respective normalized frequencies fa, fb, fc. Consequently, the level of a side lobe produced in a range close to and higher than the passband of the two-port surface acoustic wave resonator filter 310 is greatly reduced. The surface acoustic wave filter 301 according to the third embodiment thus has insertion loss vs. frequency characteristics as shown in FIG. 8, and any increase in its insertion loss is almost eliminated.

In the third embodiment, the three one-port surface acoustic wave resonators 308a, 308b, 308c are employed because the range in which the attenuation level is poor, i.e., the side lobe, close to and higher than the passband of the two-port surface acoustic wave resonator filter 310 is relatively wide. The insertion loss vs. frequency characteristics shown in FIG. 33 are produced by the two-port surface acoustic wave resonator filter 50 with no matching circuit. The insertion loss vs. frequency characteristics shown in FIG. 8 are obtained when inductive elements are connected as a matching circuit parallel to the two-port surface acoustic wave resonator filter 310.

Formation of the two-port surface acoustic wave resonator filter and the one-port surface acoustic wave resonators in each of the second and third embodiments allows their antiresonant frequencies to differ from each other by the same range.

In each of the above embodiments, the two-port surface acoustic wave resonator filter and the one-port surface acoustic wave resonators are formed on one substrate. However, the two-port surface acoustic wave resonator filter and the one-port surface acoustic wave resonators may be formed on different substrates for greater design freedom.

In each of the above embodiments, the one-port surface acoustic wave resonators have different antiresonant frequencies and are electrically connected in series to the two-port surface acoustic wave resonator filter. However, the one-port surface acoustic wave resonators may have the same antiresonant frequency and be electrically connected in series to the two-port surface acoustic wave resonator filter for a higher impedance to achieve more design flexibility.

While in each of the above embodiments the plural one-port surface acoustic wave resonators are electrically connected in series to the two-port surface acoustic wave resonator filter, only one one-port surface acoustic wave resonators may be electrically connected in series to the two-port surface acoustic wave resonator filter for effectively reducing the side lobe level insofar as the frequency range of the side lobe close to and higher than the passband is relatively narrow.

In each of the above embodiments, each of the one-port surface acoustic wave resonators comprises an transducer only. However, each of the one-port surface acoustic wave resonators may be combined with reflectors disposed one on each side thereof.

If there is a side lobe existing in a range close to and lower than the passband of the two-port surface acoustic wave resonator filter, one or more one-port surface acoustic wave resonator having an antiresonant frequency in a range close to and lower than the passband may be electrically connected in series to the input or output terminal transducer of the two-port surface acoustic wave resonator filter.

4th Embodiment

Figure 9:
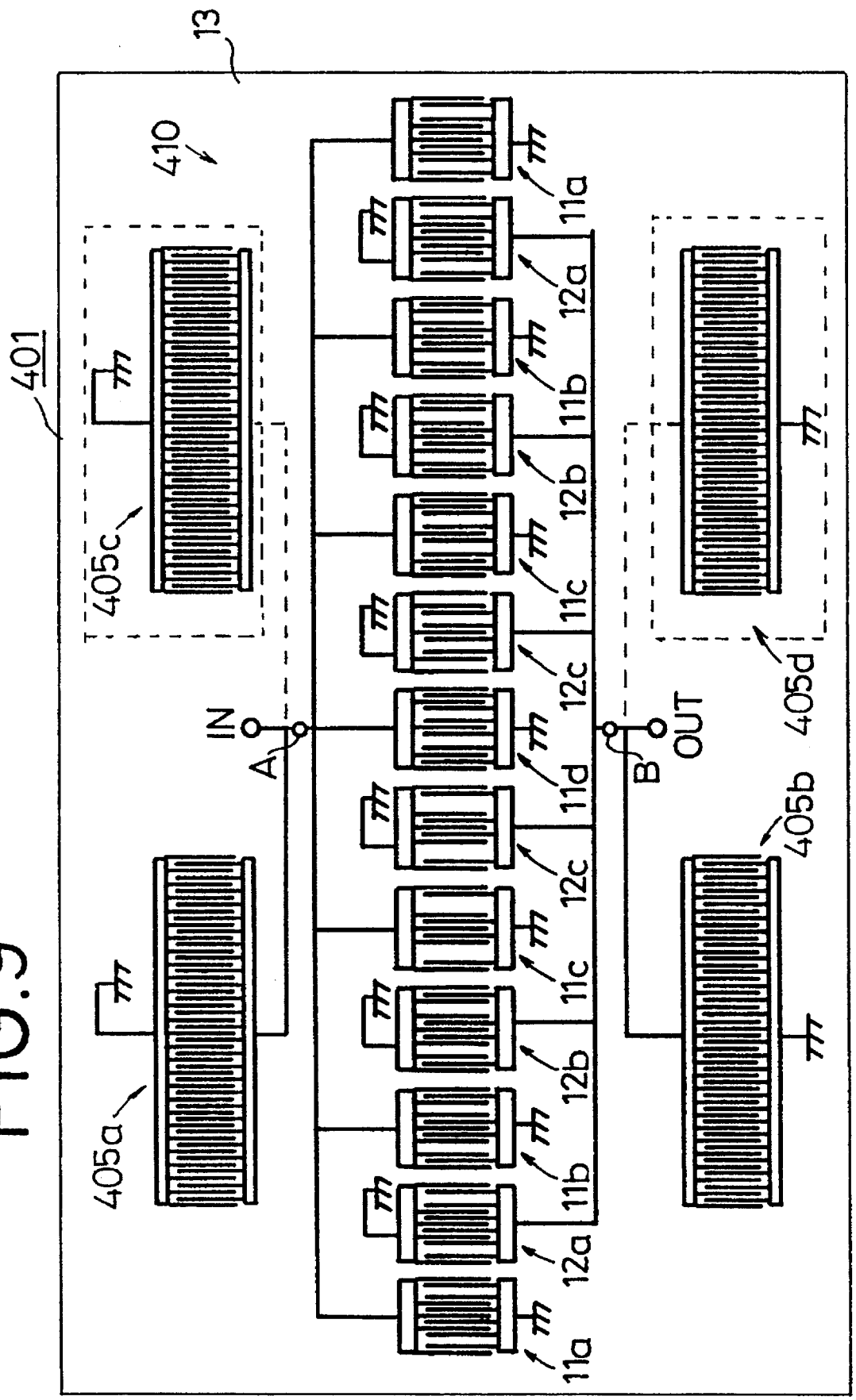
FIG. 9 is a schematic plan view of a composite surface acoustic wave filter according to a fourth embodiment of the present invention.

FIG. 9 shows a composite surface acoustic wave filter according to a fourth embodiment of the present invention.

As shown in FIG. 9, the composite surface acoustic wave filter, generally designated by the reference numeral 401, comprises an interdigitated interdigital surface acoustic wave filter 410 comprising a plurality of different withdrawal-weighted input transducers 11a, 11b, 11c, 11d, 11c, 11b, 11a disposed on a substrate 13 and a plurality of different withdrawal-weighted output transducers 12a, 12b, 12c, 12c, 12b, 12a disposed on the substrate 13, the input transducers 11a, 11b, 11c, 11d, 11c, 11b, 11a being electrically connected parallel to each other and the output transducers 12a, 12b, 12c, 12c, 12b, 12a being electrically connected parallel to each other. The composite surface acoustic wave filter 401 also includes a one-port surface acoustic wave resonator 405a electrically connected parallel to the interdigitated interdigital surface acoustic wave filter 410 through an input terminal A thereof, and a one-port surface acoustic wave resonator 405b electrically connected parallel to the interdigitated interdigital surface acoustic wave filter 410 through an output terminal B thereof. The one-port surface acoustic wave resonators 405a, 405b are also formed on the substrate 13.

The interdigitated interdigital surface acoustic wave filter 410 are identical to the interdigitated interdigital surface acoustic wave filter 2 shown in FIG. 1. The one-port surface acoustic wave resonators 405a, 405b are identical to the one-port surface acoustic wave resonators 6, 7 shown in FIG. 4.

The impedance of the one-port surface acoustic wave resonators 405a, 405b exhibits the resonant characteristics shown in FIG. 5. The impedance of the one-port surface acoustic wave resonators 405a, 405b is lower in the vicinity of the resonant frequencies thereof, and higher in the vicinity of the antiresonant frequencies thereof.

If only the one-port surface acoustic wave resonators 405a, 405b were employed as a filter, then a good level of attenuation would be achieved at the resonant frequencies of the one-port surface acoustic wave resonators 405a, 405b, but it would be difficult to widen the attenuation frequency range.

In the composite surface acoustic wave filter 401, the one-port surface acoustic wave resonators 405a, 405b are electrically connected respectively to the input and output terminals A, B of the interdigitated interdigital surface acoustic wave filter 410 parallel thereto. With this arrangement, the composite surface acoustic wave filter 401 provides a stop band in the vicinity of the resonant frequency because the impedance of the one-port surface acoustic wave resonators 405a, 405b is low at the resonant frequencies thereof, and the insertion loss is not increased because the impedance of the one-port surface acoustic wave resonators 405a, 405b is high at the antiresonant frequencies thereof. The insertion loss of the composite surface acoustic wave filter 401 thus remains substantially unchanged.

In the fourth embodiment, the pitch of electrode fingers of the one-port surface acoustic wave resonators 405a, 405b is selected to bring the resonant frequencies of the one-port surface acoustic wave resonators 405a, 405b into the stop band close to and lower than the passband of the interdigitated interdigital surface acoustic wave filter 410, and also to bring the antiresonant frequencies of the one-port surface acoustic wave resonators 405a, 405b into the passband of the interdigitated interdigital surface acoustic wave filter 410. With such resonant and antiresonant frequency settings, since the impedance of the one-port surface acoustic wave resonators 405a, 405b is low at the resonant frequencies thereof, there is obtained a stop band in the vicinity of the resonant frequencies of the one-port surface acoustic wave resonators 405a, 405b, providing sharp attenuation characteristics in a range lower than the passband of the interdigitated interdigital surface acoustic wave filter 410. Inasmuch as the impedance of the one-port surface acoustic wave resonators 405a, 405b is high at the antiresonant frequencies thereof, the insertion loss is not increased in the passband of the interdigitated interdigital surface acoustic wave filter 410, thus improving the attenuation characteristics which are impaired by the withdrawal weighting of the transducers of the interdigitated interdigital surface acoustic wave filter 410.

Figure 10:
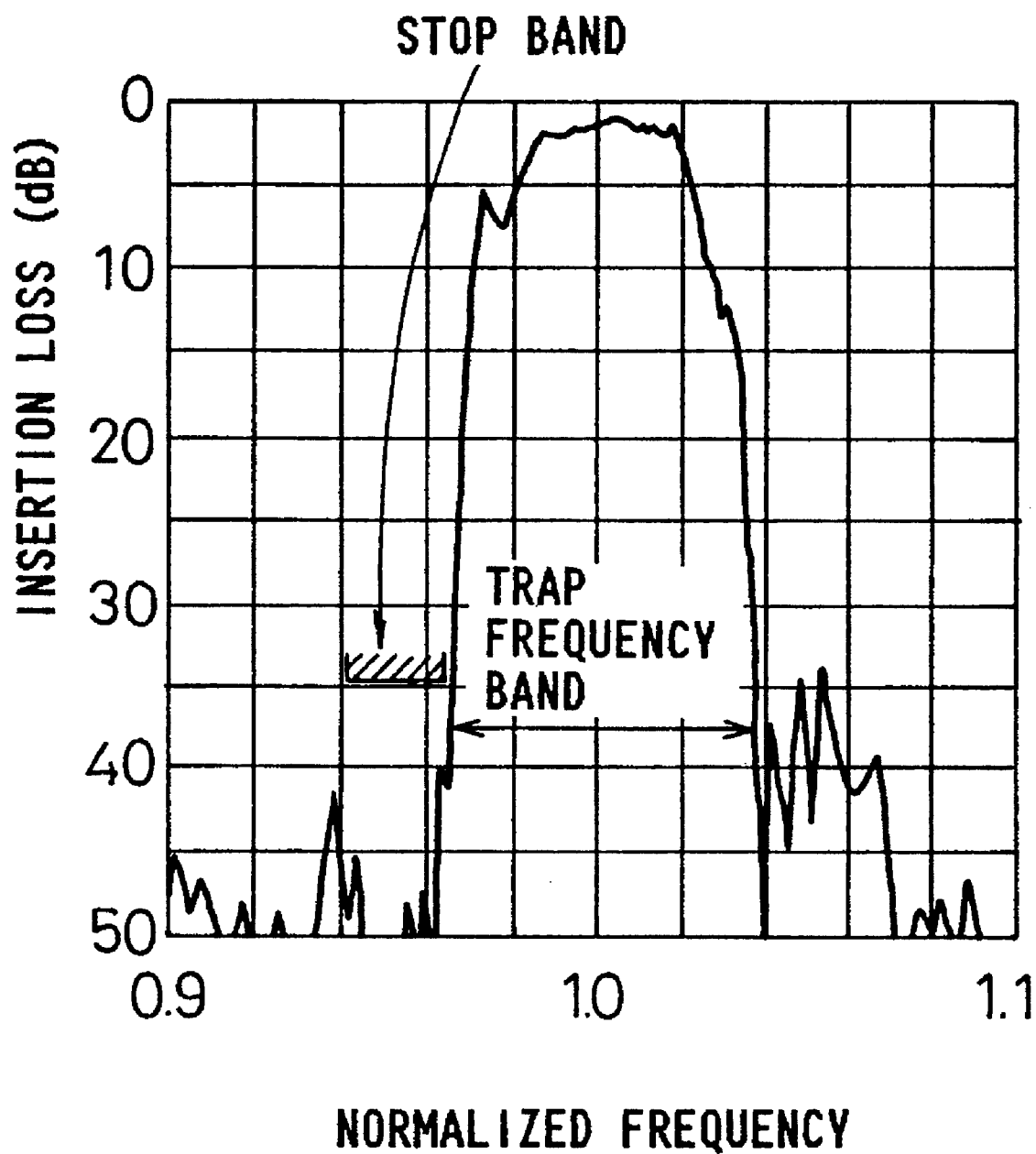
FIG. 10 is a diagram showing insertion loss vs. frequency characteristics of the composite surface acoustic wave filter according to the fourth embodiment.

FIG. 10 shows insertion loss vs. frequency characteristics of the interdigitated interdigital surface acoustic wave filter 410. As shown in FIG. 10, the attenuation level in the stop band of the composite surface acoustic wave filter 401, which is of 35 dB, is improved about 20 dB and the trap frequency range is reduced by the two one-port surface acoustic wave resonators 405a, 405b connected to the interdigitated interdigital surface acoustic wave filter 410. The composite surface acoustic wave filter 401 can thus achieve the same attenuation level as is the case with the conventional arrangement in which interdigitated interdigital surface acoustic wave filters are connected in cascade.

The one-port surface acoustic wave resonators 405a, 405b function as electrostatic capacitive elements at frequencies other than their resonant and antiresonant frequencies. Because of the electrostatic capacitance of the one-port surface acoustic wave resonators 405a, 405b, the inductance of inductive elements connected as a matching circuit parallel to the interdigitated interdigital surface acoustic wave filter 410 may be reduced, and hence the size of the inductive elements may also be reduced.

If the number of transducers and the pitch of electrode fingers of the interdigitated interdigital surface acoustic wave filter 410 are selected to design the interdigitated interdigital surface acoustic wave filter 410 such that capacitive elements are required to be connected as a matching circuit parallel to the interdigitated interdigital surface acoustic wave filter 410, then the electrostatic capacitance of such capacitive elements may be reduced because of the electrostatic capacitance of the one-port surface acoustic wave resonators 405a, 405b. Furthermore, the electrostatic capacitance of the one-port surface acoustic wave resonators 405a, 405b may be set to such a value that no matching circuit will be required to be connected parallel to the interdigitated interdigital surface acoustic wave filter 410.

In the fourth embodiment, if the one-port surface acoustic wave resonators 405a, 405b have the same resonant frequency, then the notch in the stop band close to and lower than the passband of the interdigitated interdigital surface acoustic wave filter 410 becomes deep. The resonant and antiresonant frequencies of the one-port surface acoustic wave resonators 405a, 405b may be varied by changing the pitch of electrode fingers of the one-port surface acoustic wave resonators 405a, 405b. If the pitch of electrode fingers of the one-port surface acoustic wave resonators 405a, 405b is changed to slightly vary the resonant frequencies thereof, then the frequency range in which a large attenuation level can be achieved in the stop band close to and lower than the passband of the interdigitated interdigital surface acoustic wave filter 410 is increased.

Since the one-port surface acoustic wave resonators 405a, 405b and the interdigitated interdigital surface acoustic wave filter 410 are formed on the same substrate 13, as described above, any stray capacitance which would be introduced by interconnections between the one-port surface acoustic wave resonators 405a, 405b and the interdigitated interdigital surface acoustic wave filter 410 is minimized. The relationships between the resonant frequencies of the one-port surface acoustic wave resonators 405a, 405b and the cutoff frequency in the stop band lower than the passband of the interdigitated interdigital surface acoustic wave filter 410 are the same as each other, and the frequency errors and temperature characteristics of the one-port surface acoustic wave resonators 405a, 405b at the time they are manufactured are the same as those of the interdigitated interdigital surface acoustic wave filter 410. Consequently, the differences between the cutoff frequency and the resonant and antiresonant frequencies due to the frequency errors at the time the composite surface acoustic wave filter 401 is manufactured are relatively small. As the area of the chip on which the composite surface acoustic wave filter 401 is fabricated is not large, the composite surface acoustic wave filter 401 is relatively inexpensive. The same advantages as described above can be achieved even if one of the one-port surface acoustic wave resonators 405a, 405b is dispensed with.

As indicated by the broken lines in FIG. 9, one-port surface acoustic wave resonators 405c, 405d may be electrically connected parallel to the one-port surface acoustic wave resonators 405a, 405b, respectively. If the one-port surface acoustic wave resonators 405a, 405b, 405c, 405d have the same resonant frequency, then the notch in the stop band close to and lower than the passband of the interdigitated interdigital surface acoustic wave filter 410 becomes deeper. If the resonant frequencies of the one-port surface acoustic wave resonators 405a, 405b, 405c, 405d are slightly varied from each other, then the frequency range in which a large attenuation level can be achieved in the stop band close to and lower than the passband of the interdigitated interdigital surface acoustic wave filter 410 is increased.

5th Embodiment

Figure 11:
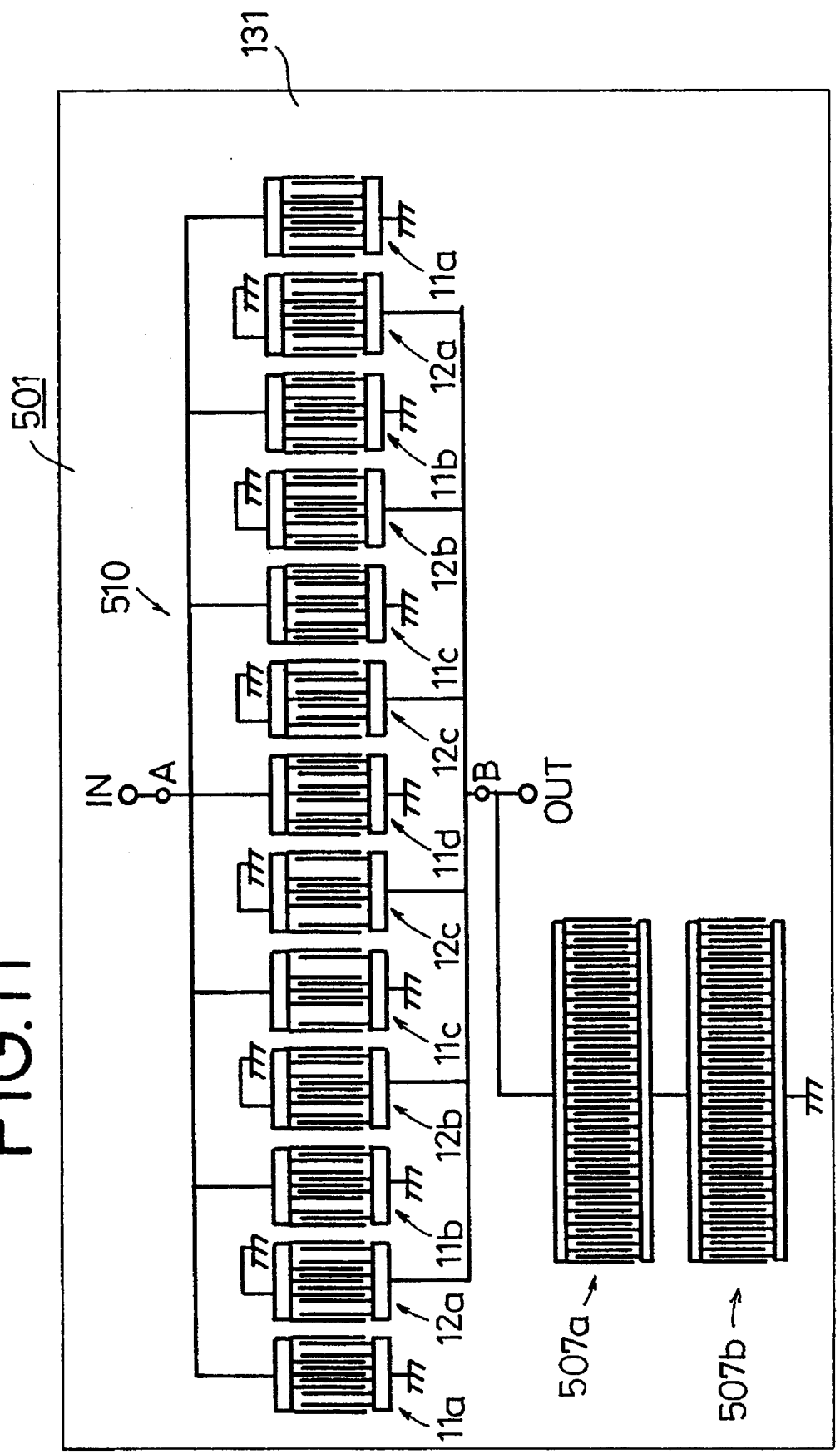
FIG. 11 is a schematic plan view of a composite surface acoustic wave filter according to a fifth embodiment of the present invention.

A composite surface acoustic wave filter according to a fifth embodiment of the present invention is shown in FIG. 11.

As shown in FIG. 11, the composite surface acoustic wave filter, generally designated by the reference numeral 501, comprises an interdigitated interdigital surface acoustic wave filter 510 and two one-port surface acoustic wave resonators 507a, 507b which are formed on a substrate 13. The one-port surface acoustic wave resonators 507a, 507b are electrically connected in series to each other, and also electrically connected parallel to the interdigitated interdigital surface acoustic wave filter 510 at an output terminal B thereof. The one-port surface acoustic wave resonators 507a, 507b are identical to the one-port surface acoustic wave resonator 6(7) shown in FIG. 4.

As shown in FIG. 5, the impedance of the one-port surface acoustic wave resonators 507a, 507b is low at the resonant frequencies thereof and high at the antiresonant frequencies thereof.

The resonant frequencies of the one-port surface acoustic wave resonators 507a, 507b are brought into the stop band close to and lower than the passband of the interdigitated interdigital surface acoustic wave filter 510, and also the antiresonant frequencies of the one-port surface acoustic wave resonators 507a, 507b are brought into the passband of the interdigitated interdigital surface acoustic wave filter 510. With such resonant and antiresonant frequency settings, singe the impedance of the one-port surface acoustic wave resonators 507a, 507b is low at the resonant frequencies thereof, there is obtained a stop band in the vicinity of the resonant frequencies of the one-port surface acoustic wave resonators 507a, 507b, providing sharp attenuation characteristics in a range lower than the passband of the interdigitated interdigital surface acoustic wave filter 510. Since the impedance of the one-port surface acoustic wave resonators 507a, 507b is high at the antiresonant frequencies thereof, the insertion loss is not increased in the passband of the interdigitated interdigital surface acoustic wave filter 510, thus improving the attenuation characteristics which are impaired by the withdrawal weighting of the transducers of the interdigitated interdigital surface acoustic wave filter 510.

Since the one-port surface acoustic wave resonators 507a, 507b are electrically connected in series to each other, their impedance at the antiresonant frequencies thereof can be increased, and their electrostatic capacitance at frequencies other than the resonant and antiresonant frequencies can be reduced.

If the one-port surface acoustic wave resonators 507a, 507b have the same resonant frequency, then the impedance in the vicinity of the antiresonant frequencies thereof is increased, and the insertion loss is not increased. The resonant frequencies of the one-port surface acoustic wave resonators 507a, 507b may be varied by differing the pitch of electrode fingers of the one-port surface acoustic wave resonators 507a, 507b. If the one-port surface acoustic wave resonators 507a, 507b have slightly different resonant frequencies, then the frequency range in which a large attenuation level can be achieved in the stop band close to and lower than the passband of the interdigitated interdigital surface acoustic wave filter 510 is increased. In this case, there is no increase in the insertion loss in the vicinity of the antiresonant frequency in the passband.

Figure 12:
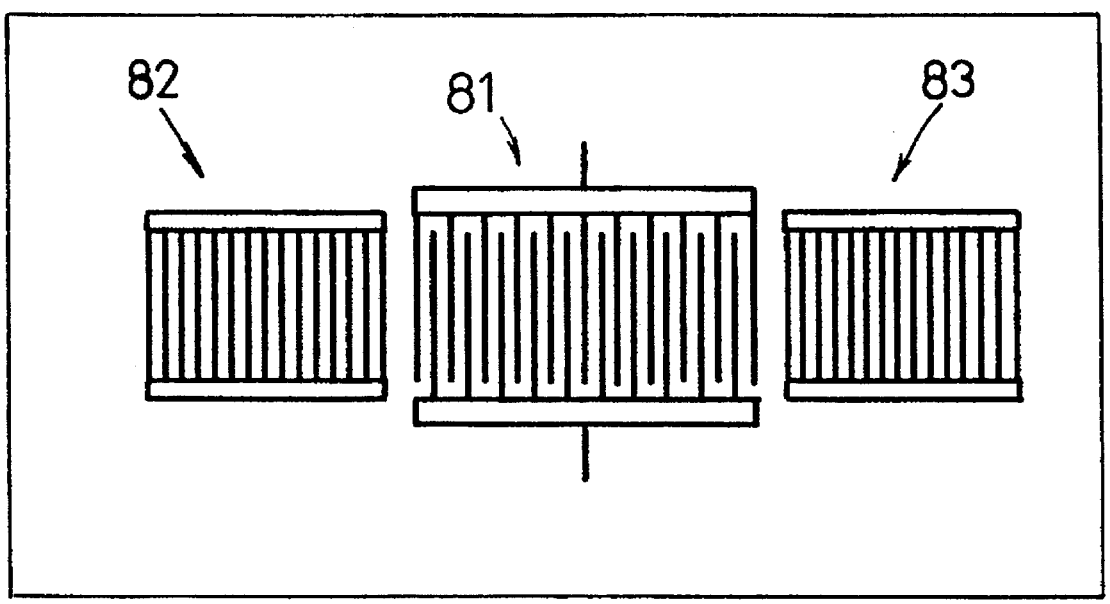
FIG. 12 is a schematic plan view of a one-port surface acoustic wave resonator with reflectors which may be employed in the fourth and fifth embodiments.

In the fourth and fifth embodiments, the one-port surface acoustic wave resonators 405a, 405b, 507a, 507b are arranged as shown in FIG. 4. However, as shown in FIG. 12, each of the one-port surface acoustic wave resonators 405a, 405b, 507a, 507b may be composed of an transducer 81 and a pair of reflectors 82, 83 disposed one on each side of the transducer 81.

6th Embodiment

Figure 13:
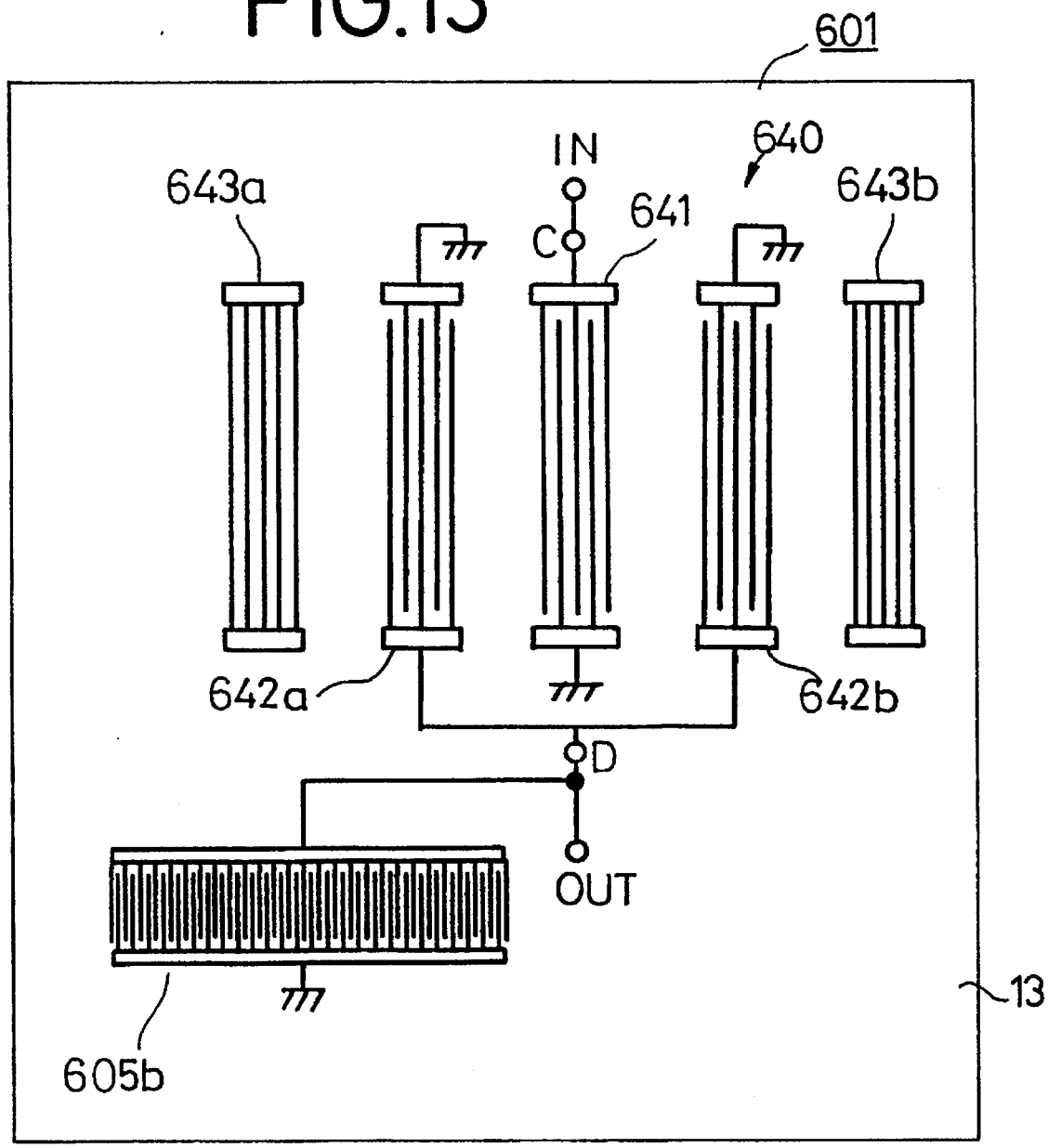
FIG. 13 is a schematic plan view of a composite surface acoustic wave filter according to a sixth embodiment of the present invention.

FIG. 13 illustrates a composite surface acoustic wave filter according to a sixth embodiment of the present invention.

As shown in FIG. 13, the composite surface acoustic wave filter, generally designated by the reference numeral 601, comprises a two-port surface acoustic wave resonator filter 640 composed of an input transducer 641, two output transducers 642a, 642b disposed one on each side of the input transducer 641 and electrically connected parallel to the input transducer 641, and two reflectors 643a, 643b disposed outside of the respective output transducers 642a, 642b remotely from the input transducer 641, and a one-port surface acoustic wave resonator 605b electrically connected parallel to the two-port surface acoustic wave resonator filter 640 at an output terminal D thereof. The two-port surface acoustic wave resonator filter 640 and the one-port surface acoustic wave resonator 605b are formed on a substrate 13. The two-port surface acoustic wave resonator filter 640 has essentially the same insertion loss vs. frequency characteristics as those of the interdigitated interdigital surface acoustic wave filters 410, 510.

The insertion loss vs. frequency characteristics of the composite surface acoustic wave filter 601 are improved by selecting the resonant frequency of the one-port surface acoustic wave resonator 605b to be in the stop band close to and lower than the passband of the two-port surface acoustic wave resonator filter 640.

In the fourth through sixth embodiments, the resonant frequencies of the one-port surface acoustic wave resonators 405a–405d, 507a, 507b, 605b are selected to be in the stop bands close to and lower than the passbands of the interdigitated interdigital surface acoustic wave filters 410, 510 and the two-port surface acoustic wave resonator filter 640. However, the resonant frequencies of the one-port surface acoustic wave resonators 405a–405d, 507a, 507b, 605b may be selected to be in a frequency band where a side lobe exists, lower than the passbands of the interdigitated interdigital surface acoustic wave filters 410, 510 and the two-port surface acoustic wave resonator filter 640, for thereby suppressing the side lobe in the frequency range lower than the passband.

7th Embodiment

Figure 14:
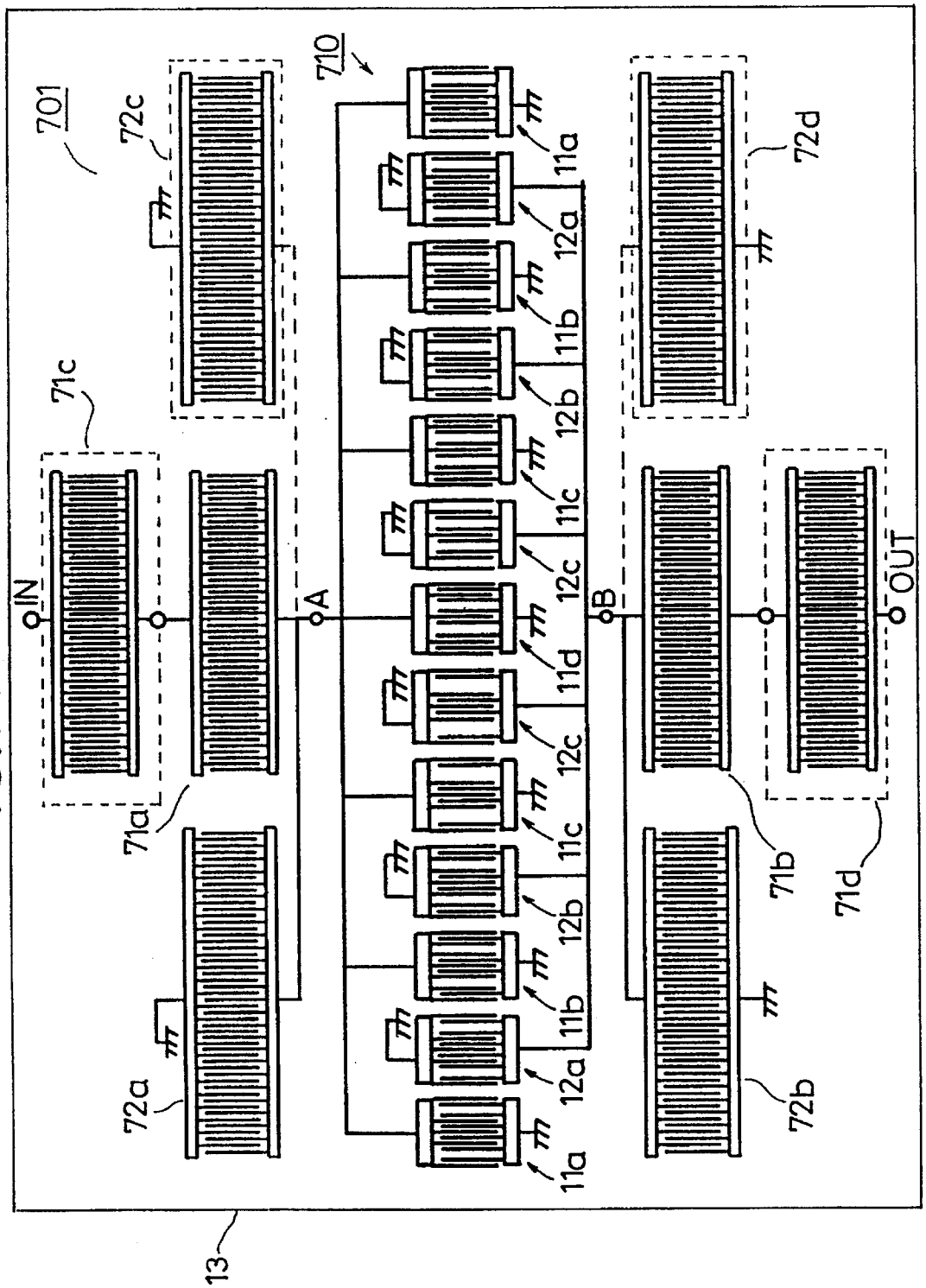
FIG. 14 is a schematic plan view of a composite surface acoustic wave filter according to a seventh embodiment of the present invention.

FIG. 14 shows a composite surface acoustic wave filter according to a seventh embodiment of the present invention.

As shown in FIG. 14, the composite surface acoustic wave filter, generally designated by the reference numeral 701, comprises an interdigitated interdigital surface acoustic wave filter 710 with different withdrawal-weighted transducers, a one-port surface acoustic wave resonator 71a electrically connected in series to the interdigitated interdigital surface acoustic wave filter 710 at an input terminal A thereof, a one-port surface acoustic wave resonator 71b electrically connected in series to the interdigitated interdigital surface acoustic wave filter 710 at an output terminal B thereof, a one-port surface acoustic wave resonator 72a electrically connected parallel to the interdigitated interdigital surface acoustic wave filter 710 at the input terminal A thereof, and a one-port surface acoustic wave resonator 72b electrically connected parallel to the interdigitated interdigital surface acoustic wave filter 710 at the output terminal B thereof. The interdigitated interdigital surface acoustic wave filter 710 and the one-port surface acoustic wave resonators 71a, 71b, 72a, 72b are formed on a substrate 13.

The interdigitated interdigital surface acoustic wave filter 710 with different withdrawal-weighted transducers is identical to the interdigitated interdigital surface acoustic wave filter 410 shown in FIG. 9. The one-port surface acoustic wave resonators 71a, 71b, 72a, 72b are identical to the one-port surface acoustic wave resonator 6(7) shown in FIG. 4.

The impedance of the one-port surface acoustic wave resonators 71a, 71b, 72a, 72b exhibits the resonant characteristics shown in FIG. 5. The impedance of the one-port surface acoustic wave resonators 71a, 71b, 72a, 72b is lower in the vicinity of the resonant frequencies thereof, and higher in the vicinity of the antiresonant frequencies thereof.

If only the one-port surface acoustic wave resonators 71a, 71b, 72a, 72b were employed as a filter, then a good level of attenuation would be achieved at the antiresonant frequencies of the one-port surface acoustic wave resonators 71a, 71b, 72a, 72b, but it would be difficult to widen the attenuation frequency range.

In the composite surface acoustic wave filter 701, the one-port surface acoustic wave resonators 71a, 71b are electrically connected to the input and output terminals A, B, respectively, of the interdigitated interdigital surface acoustic wave filter 710 in series thereto. With this arrangement, the composite surface acoustic wave filter 701 provides a stop band in the vicinity of the antiresonant frequency because the impedance of the one-port surface acoustic wave resonators 71a, 71b is high at the antiresonant frequencies thereof, and the insertion loss is not increased because the impedance of the one-port surface acoustic wave resonators 71a, 71b is low at the resonant frequencies thereof. The insertion loss of the composite surface acoustic wave filter 701 thus remains substantially unchanged.

In the composite surface acoustic wave filter 701, the one-port surface acoustic wave resonators 72a, 72b are electrically connected to the input and output terminals A, B, respectively, of the interdigitated interdigital surface acoustic wave filter 710 parallel thereto. With this arrangement, the composite surface acoustic wave filter 701 provides a stop band in the vicinity of the resonant frequency because the impedance of the one-port surface acoustic wave resonators 72a, 72b is low at the resonant frequencies thereof, and the insertion loss is not increased because the impedance of the one-port surface acoustic wave resonators 72a, 72b is high at the antiresonant frequencies thereof. The insertion loss of the composite surface acoustic wave filter 701 thus remains substantially unchanged.

In the seventh embodiment, the pitch of electrode fingers of the one-port surface acoustic wave resonators 71a, 71b is selected to bring the antiresonant frequencies of the one-port surface acoustic wave resonators 71a, 71b into the stop band close to and higher than the passband of the interdigitated interdigital surface acoustic wave filter 710, and also to bring the resonant frequencies of the one-port surface acoustic wave resonators 71a, 71b into the passband of the interdigitated interdigital surface acoustic wave filter 710. Similarly, the pitch of electrode fingers of the one-port surface acoustic wave resonators 72a, 72b is selected to bring the resonant frequencies of the one-port surface acoustic wave resonators 72a, 72b into the stop band close to and lower than the passband of the interdigitated interdigital surface acoustic wave filter 710, and also to bring the antiresonant frequencies of the one-port surface acoustic wave resonators 72a, 72b into the passband of the interdigitated interdigital surface acoustic wave filter 710. With such resonant and antiresonant frequency settings, since the impedance of the one-port surface acoustic wave resonators 71a, 71b is high at the antiresonant frequencies thereof, there is obtained a stop band in the vicinity of the antiresonant frequencies of the one-port surface acoustic wave resonators 71a, 71b, providing sharp attenuation characteristics in a range higher than the passband of the interdigitated interdigital surface acoustic wave filter 710. Because the impedance of the one-port surface acoustic wave resonators 72a, 72b is low at the resonant frequencies thereof, there is obtained a stop band in the vicinity of the resonant frequencies of the one-port surface acoustic wave resonators 72a, 72b, providing sharp attenuation characteristics in a range lower than the passband of the interdigitated interdigital surface acoustic wave filter 710.

Inasmuch as the impedance of the one-port surface acoustic wave resonators 71a, 71b is low at the resonant frequencies thereof, the insertion loss is not increased in the passband of the interdigitated interdigital surface acoustic wave filter 710, and also inasmuch as the impedance of the one-port surface acoustic wave resonators 72a, 72b is high at the antiresonant frequencies thereof, the insertion loss is not increased in the passband of the interdigitated interdigital surface acoustic wave filter 710, thus improving the attenuation characteristics which are impaired by the withdrawal weighting of the transducers of the interdigitated interdigital surface acoustic wave filter 710.

Figure 15:
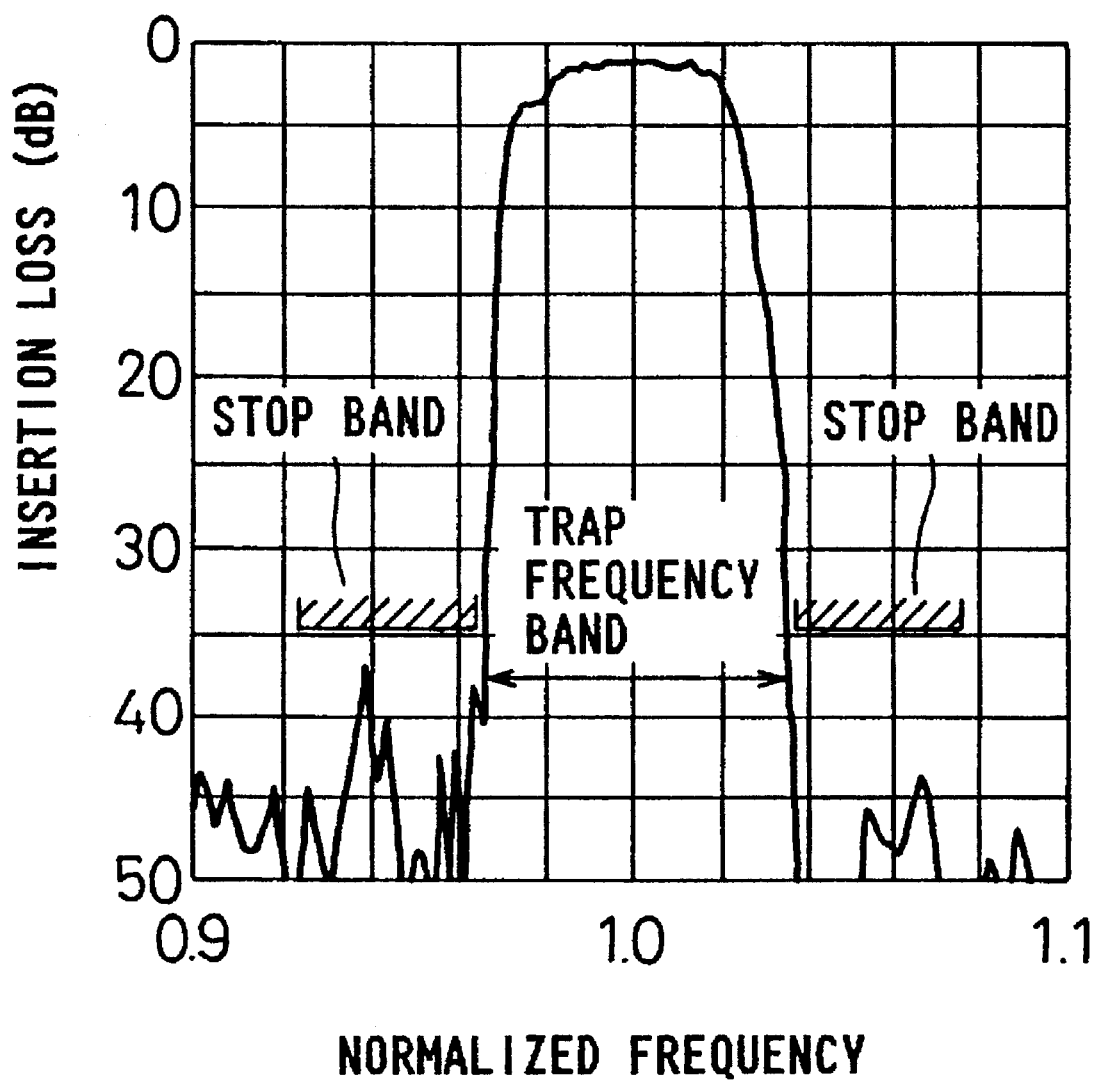
FIG. 15 is a diagram showing insertion loss vs. frequency characteristics of the composite surface acoustic wave filter according to the seventh embodiment.

FIG. 15 shows insertion loss vs. frequency characteristics of the composite surface acoustic wave filter 701 with inductive elements connected as a matching circuit parallel to the interdigitated interdigital surface acoustic wave filter 710. As shown in FIG. 15, the attenuation level in the stop bands close to and higher and lower than the passband of the composite surface acoustic wave filter 701 is of 35 dB. The attenuation level in the stop band close to and lower than the passband is improved about 15 dB and the attenuation level in the stop band close to and higher than the passband is improved about 20 dB, and the trap frequency range is reduced by the one-port surface acoustic wave resonators 71a, 71b, 72a, 72b connected to the interdigitated interdigital surface acoustic wave filter 710. The composite surface acoustic wave filter 701 can thus achieve the same attenuation level as is the case with the conventional arrangement in which interdigitated interdigital surface acoustic wave filters are connected in cascade.

The one-port surface acoustic wave resonators 71a, 71b, 72a, 72b function as electrostatic capacitive elements at frequencies other than their resonant and antiresonant frequencies. Because of the electrostatic capacitance of the one-port surface acoustic wave resonators 72a, 72b, the inductance of inductive elements connected as a matching circuit parallel to the interdigitated interdigital surface acoustic wave filter 710 may be reduced, and hence the size of the inductive elements may also be reduced.

If the number of transducers and the pitch of electrode fingers of the interdigitated interdigital surface acoustic wave filter 710 are selected to design the interdigitated interdigital surface acoustic wave filter 710 such that capacitive elements are required to be connected as a matching circuit parallel to the interdigitated interdigital surface acoustic wave filter 710, then the electrostatic capacitance of such capacitive elements may be reduced because of the electrostatic capacitance of the one-port surface acoustic wave resonators 72a, 72b. Furthermore, the electrostatic capacitance of the one-port surface acoustic wave resonators 72a, 72b may be set to such a value that no matching circuit will be required to be connected parallel to the interdigitated interdigital surface acoustic wave filter 710. If a matching circuit needs to be connected in series to the interdigitated interdigital surface acoustic wave filter 710, such a matching circuit may partly or wholly be dispensed with due to the electrostatic capacitance of the one-port surface acoustic wave resonators 71a, 71b.

In the seventh embodiment, if the one-port surface acoustic wave resonators 71a, 71b have the same antiresonant frequency, then the notch in the stop band close to and higher than the passband of the interdigitated interdigital surface acoustic wave filter 710 becomes deep. If the pitch of electrode fingers of the one-port surface acoustic wave resonators 71a, 71b is changed to slightly vary the antiresonant frequencies thereof, then the frequency range in which a large attenuation level can be achieved in the stop band close to and higher than the passband of the interdigitated interdigital surface acoustic wave filter 710 is increased.

Since the one-port surface acoustic wave resonators 71a, 71b, 72a, 72b and the interdigitated interdigital surface acoustic wave filter 710 are formed on the same substrate 13, as described above, any stray capacitance which would be introduced by interconnections between the one-port surface acoustic wave resonators 71a, 71b, 72a, 72b and the interdigitated interdigital surface acoustic wave filter 710 is minimized. The relationships between the antiresonant frequencies of the one-port surface acoustic wave resonators 71a, 71b and the cutoff frequency in the stop band higher than the passband of the interdigitated interdigital surface acoustic wave filter 710 are the same as each other, and the relationships between the resonant frequencies of the one-port surface acoustic wave resonators 72a, 72b and the cutoff frequency in the stop band lower than the passband of the interdigitated interdigital surface acoustic wave filter 710 are the same as each other. The frequency errors and temperature characteristics of the one-port surface acoustic wave resonators 71a, 71b, 72a, 72b at the time they are manufactured are the same as those of the interdigitated interdigital surface acoustic wave filter 710. Consequently, the differences between the cutoff frequency and the resonant and antiresonant frequencies due to the frequency errors at the time the composite surface acoustic wave filter 701 is manufactured are relatively small. As the area of the chip on which the composite surface acoustic wave filter 701 is fabricated is not large, the composite surface acoustic wave filter 701 is relatively inexpensive. The same advantages as described above can be achieved even if one of the one-port surface acoustic wave resonators 71a, 71b is dispensed with. Similarly, the same advantages as described above can be achieved even if one of the one-port surface acoustic wave resonators 72a, 72b is dispensed with.

As indicated by the broken lines in FIG. 14, one-port surface acoustic wave resonators 71c, 71d may be electrically connected parallel to the one-port surface acoustic wave resonators 71a, 71b, respectively. If the one-port surface acoustic wave resonators 71a, 71b, 71c, 71d have the same antiresonant frequency, then the notch in the stop band close to and higher than the passband of the interdigitated interdigital surface acoustic wave filter 710 becomes deeper. If the antiresonant frequencies of the one-port surface acoustic wave resonators 71a, 71b, 71c, 71d are slightly varied from each other, then the frequency range in which a large attenuation level can be achieved in the stop band close to and higher than the passband of the interdigitated interdigital surface acoustic wave filter 710 is increased.

Likewise, as indicated by the broken lines in FIG. 14, one-port surface acoustic wave resonators 72c, 72d may be electrically connected parallel to the one-port surface acoustic wave resonators 72a, 72b, respectively. If the one-port surface acoustic wave resonators 72a, 72b, 72c, 72d have the same resonant frequency, then the notch in the stop band close to and lower than the passband of the interdigitated interdigital surface acoustic wave filter 710 becomes deeper. If the resonant frequencies of the one-port surface acoustic wave resonators 72a, 72b, 72c, 72d are slightly varied from each other, then the frequency range in which a large attenuation level can be achieved in the stop band close to and lower than the passband of the interdigitated interdigital surface acoustic wave filter 710 is increased.

In the seventh embodiment, the one-port surface acoustic wave resonator 72a is connected parallel to the transducers of the interdigitated interdigital surface acoustic wave filter 710. However, the one-port surface acoustic wave resonator 72a may be connected parallel to the input terminal IN. Similarly, while the one-port surface acoustic wave resonator 72b is connected parallel to the transducers of the interdigitated interdigital surface acoustic wave filter 710, the one-port surface acoustic wave resonator 72a may be connected parallel to the output terminal OUT.

8th Embodiment

Figure 16:
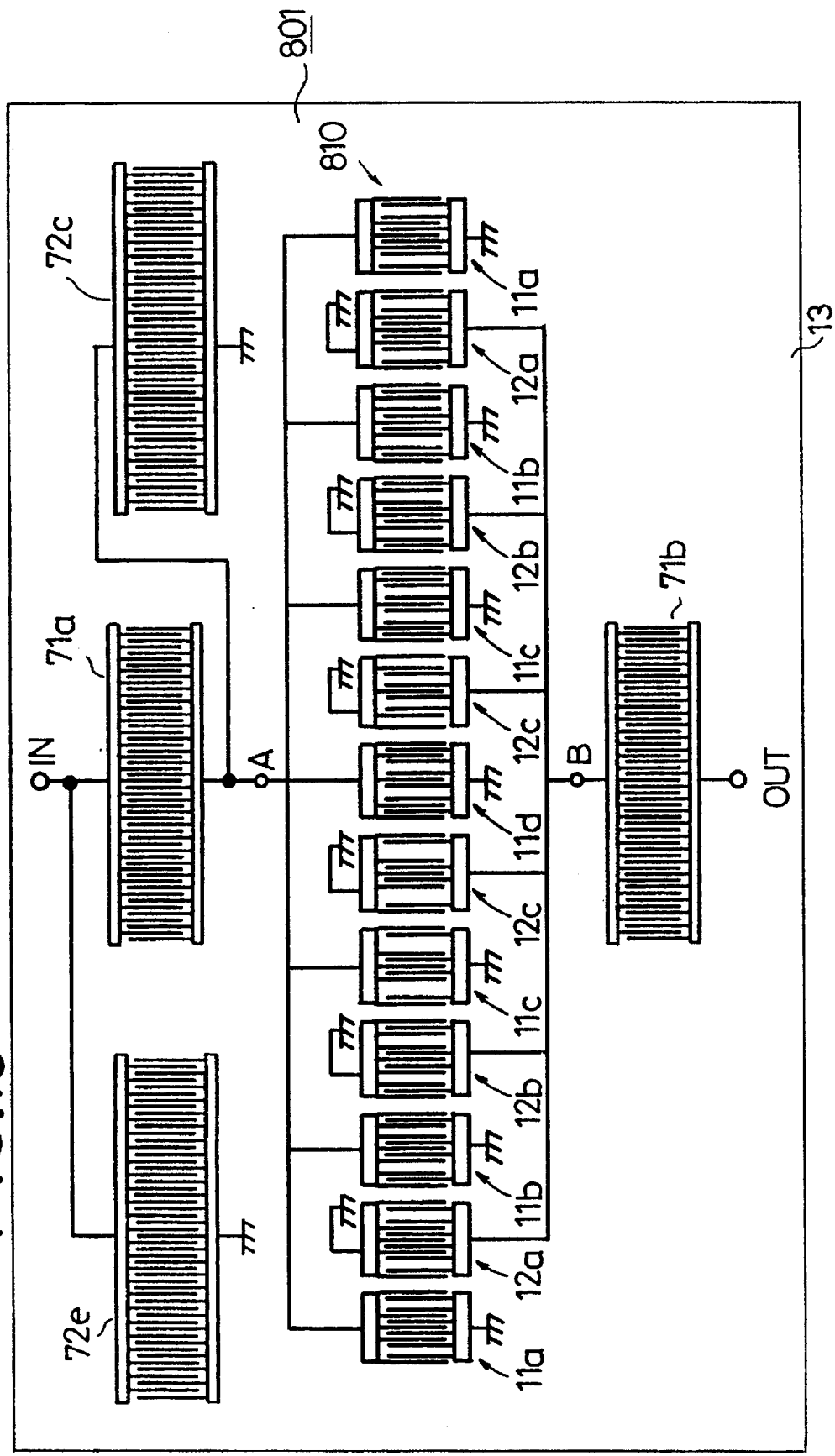
FIG. 16 is a schematic plan view of a composite surface acoustic wave filter according to an eighth embodiment of the present invention.

FIG. 16 shows a composite surface acoustic wave filter according to an eighth embodiment of the present invention.

As shown in FIG. 16, the composite surface acoustic wave filter, generally designated by the reference numeral 801, comprises an interdigitated interdigital surface acoustic wave filter 810 with different withdrawal-weighted transducers and one-port surface acoustic wave resonators 71a, 71b, 72c, 72e which are formed on a substrate 13. The one-port surface acoustic wave resonator 71a is electrically connected in series to the interdigitated interdigital surface acoustic wave filter 810 at an input terminal A thereof. The one-port surface acoustic wave resonator 71b is electrically connected in series to the interdigitated interdigital surface acoustic wave filter 810 at an output terminal B thereof. The one-port surface acoustic wave resonator 72c is electrically connected parallel to the interdigitated interdigital surface acoustic wave filter 810 at the input terminal A thereof. The one-port surface acoustic wave resonator 72e is electrically connected parallel to the interdigitated interdigital surface acoustic wave filter 810 at an input terminal IN of the composite surface acoustic filter 801. The one-port surface acoustic wave resonators 71a, 72c, 72e are thus connected as a pi network between the input terminal IN of the composite surface acoustic filter 801 and the input terminal A of the interdigitated interdigital surface acoustic wave filter 810.

The interdigitated interdigital surface acoustic wave filter 810 is identical to the interdigitated interdigital surface acoustic wave filter 710 shown in FIG. 14. The one-port surface acoustic wave resonators 71a, 71b, 72c, 72e are identical to the one-port surface acoustic wave resonator 6(7) shown in FIG. 4.

The impedance of the one-port surface acoustic wave resonators 71a, 71b, 72c, 72e is lower in the vicinity of the resonant frequencies thereof, and higher in the vicinity of the antiresonant frequencies thereof, as shown in FIG. 5.

The antiresonant frequencies of the one-port surface acoustic wave resonators 71a, 71b are selected to be in the stop band close to and higher than the passband of the interdigitated interdigital surface acoustic wave filter 810, and the resonant frequencies thereof are selected to be in the passband of the interdigitated interdigital surface acoustic wave filter 810. The resonant frequencies of the one-port surface acoustic wave resonators 72c, 72e are selected to be in the stop band close to and lower than the passband of the interdigitated interdigital surface acoustic wave filter 810, and the antiresonant frequencies thereof are selected to be in the passband of the interdigitated interdigital surface acoustic wave filter 810.

With such resonant and antiresonant frequency settings, since the impedance of the one-port surface acoustic wave resonators 71a, 71b is high at the antiresonant frequencies thereof, there is obtained a stop band in the vicinity of the antiresonant frequencies thereof, providing sharp attenuation characteristics in a range higher than the passband of the interdigitated interdigital surface acoustic wave filter 810. Because the impedance of the one-port surface acoustic wave resonators 71a, 71b is low at the resonant frequencies thereof, the insertion loss is not increased in the passband of the interdigitated interdigital surface acoustic wave filter 810.

Since the impedance of the one-port surface acoustic wave resonators 72c, 72e is low at the resonant frequencies thereof, there is obtained a stop band in the vicinity of the resonant frequencies thereof, providing sharp attenuation characteristics in a range lower than the passband of the interdigitated interdigital surface acoustic wave filter 810. Because the impedance of the one-port surface acoustic wave resonators 72c, 72e is high at the antiresonant frequencies thereof, the insertion loss is not increased in the passband of the interdigitated interdigital surface acoustic wave filter 810.

If the one-port surface acoustic wave resonators 71a, 71b have the same antiresonant frequency, if the one-port surface acoustic wave resonators 71a, 71b have slightly different antiresonant frequencies, if the one-port surface acoustic wave resonators 72c, 72e have the same resonant frequency, or if the one-port surface acoustic wave resonators 72c, 72e have slightly different resonant frequencies, the composite surface acoustic wave filter 801 operates in the same manner as with the seventh embodiment described above.

Therefore, the attenuation characteristics which are impaired by the withdrawal weighting of the transducers of the interdigitated interdigital surface acoustic wave filter 810 are improved.

In the seventh and eighth embodiments, the one-port surface acoustic wave resonators 71a–71d, 72a–72e are arranged as shown in FIG. 4. However, as shown in FIG. 12, each of the one-port surface acoustic wave resonators 71a–71d, 72a–72e may be composed of the transducer 81 and the pair of reflectors 82, 83 disposed one on each side of the transducer 81.

9th Embodiment

Figure 17:
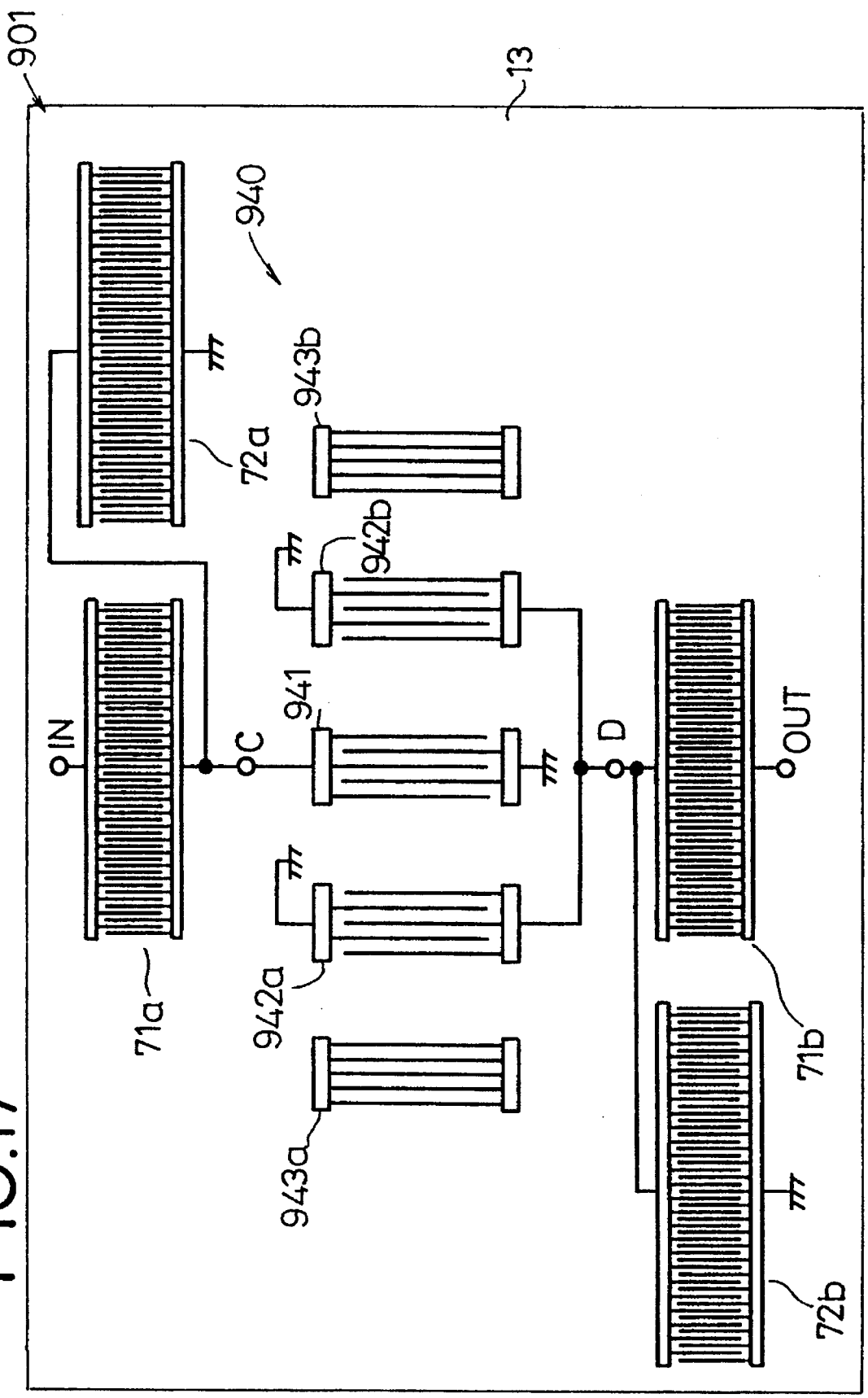
FIG. 17 is a schematic plan view of a composite surface acoustic wave filter according to a ninth embodiment of the present invention.

FIG. 17 illustrates a composite surface acoustic wave filter according to a ninth embodiment of the present invention.

As shown in FIG. 17, the composite surface acoustic wave filter, generally designated by the reference numeral 901, comprises a two-port surface acoustic wave resonator filter 940 composed of an input transducer 941, two output transducers 942a, 942b disposed one on each side of the input transducer 941 and electrically connected parallel to the input transducer 941, and two reflectors 943a, 943b disposed outside of the respective output transducers 942a, 942b remotely from the input transducer 941, a one-port surface acoustic wave resonator 71a electrically connected in series to the two-port surface acoustic wave filter 940 at an input terminal C thereof, a one-port surface acoustic wave resonator 72a electrically connected parallel to the two-port surface acoustic wave filter 940 at the input terminal C thereof, a one-port surface acoustic wave resonator 71b electrically connected in series to the two-port surface acoustic wave filter 940 at an output terminal D thereof, and a one-port surface acoustic wave resonator 72b electrically connected parallel to the two-port surface acoustic wave filter 940 at the output terminal D thereof. The two-port surface acoustic wave filter 940 and the one-port surface acoustic wave resonators 71a, 71b, 72a, 72b are formed on a substrate 13. The two-port surface acoustic wave filter 940 has insertion loss vs. frequency characteristics which are the same as the interdigitated interdigital surface acoustic wave filter 10.

The insertion loss vs. frequency characteristics of the composite surface acoustic wave filter 901 are improved by bringing the antiresonant frequencies of the one-port surface acoustic wave resonators 71a, 71b into the stop band close to and higher than the passband of the two-port surface acoustic wave filter 940, and also by bringing the resonant frequencies of the one-port surface acoustic wave resonators 72a, 72b into the stop band close to and lower than the passband of the two-port surface acoustic wave filter 940.

In the seventh through ninth embodiments, the resonant frequencies of the one-port surface acoustic wave resonators 72a–72e are selected to be in the stop bands close to and lower than the passbands of the interdigitated interdigital surface acoustic wave filters 710, 810 and the two-port surface acoustic wave filter 940. However, the resonant frequencies of the one-port surface acoustic wave resonators 72a–72e may be selected to be in a frequency band where a side lobe exists, lower than the passbands of the interdigitated interdigital surface acoustic wave filters 710, 810 and the two-port surface acoustic wave resonator filter 940, for thereby suppressing the side lobe in the frequency range lower than the passband.

Similarly, in the seventh through ninth embodiments, the antiresonant frequencies of the one-port surface acoustic wave resonators 71a–71d are selected to be in the stop bands close to and higher than the passbands of the interdigitated interdigital surface acoustic wave filters 710, 810 and the two-port surface acoustic wave filter 940. However, the antiresonant frequencies of the one-port surface acoustic wave resonators 71a–71d may be selected to be in a frequency band where a side lobe exists, higher than the passbands of the interdigitated interdigital surface acoustic wave filters 710, 810 and the two-port surface acoustic wave resonator filter 940, for thereby suppressing the side lobe in the frequency range higher than the passband.

10th Embodiment

An application of a composite surface acoustic wave filter according to the present invention will be described below.

Figure 18:
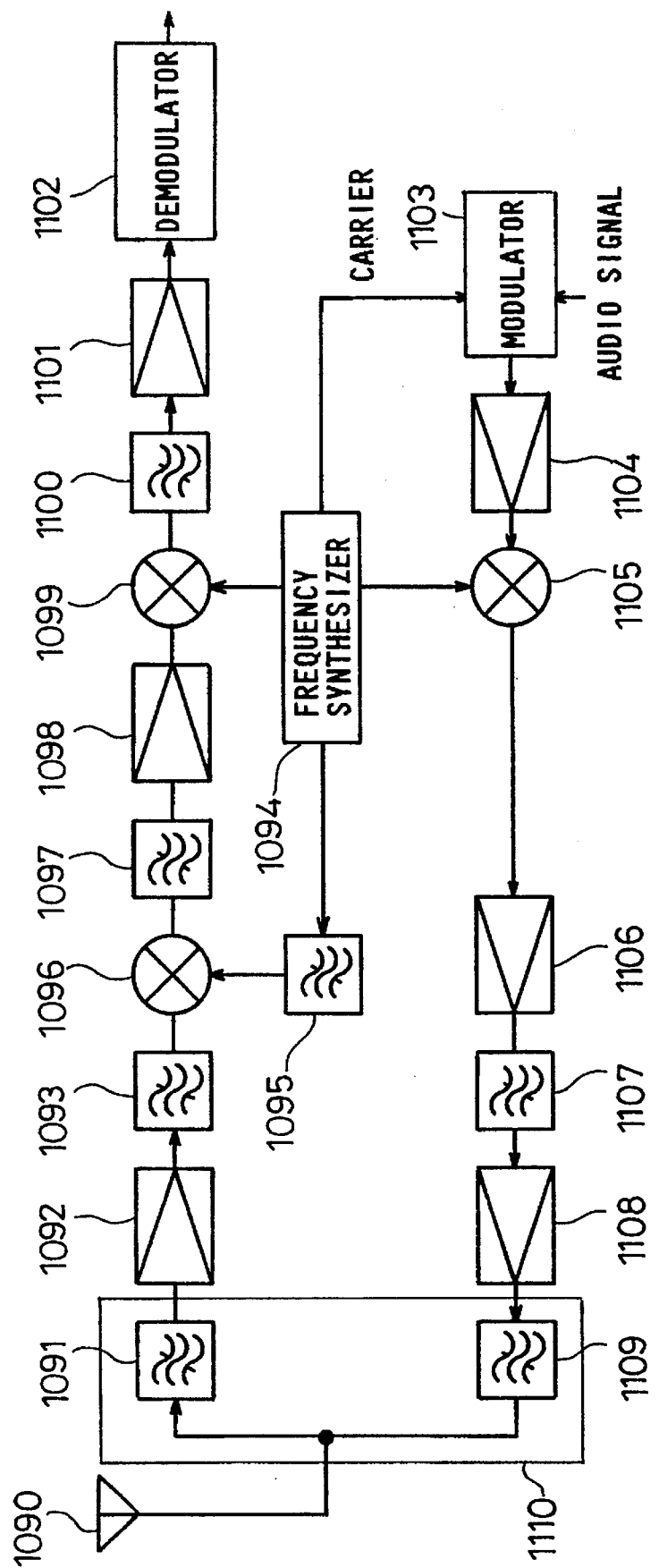
FIG. 18 is a block diagram of a portion of a mobile communication system which incorporates a composite surface acoustic wave filter according to the present invention.
Figure 19:
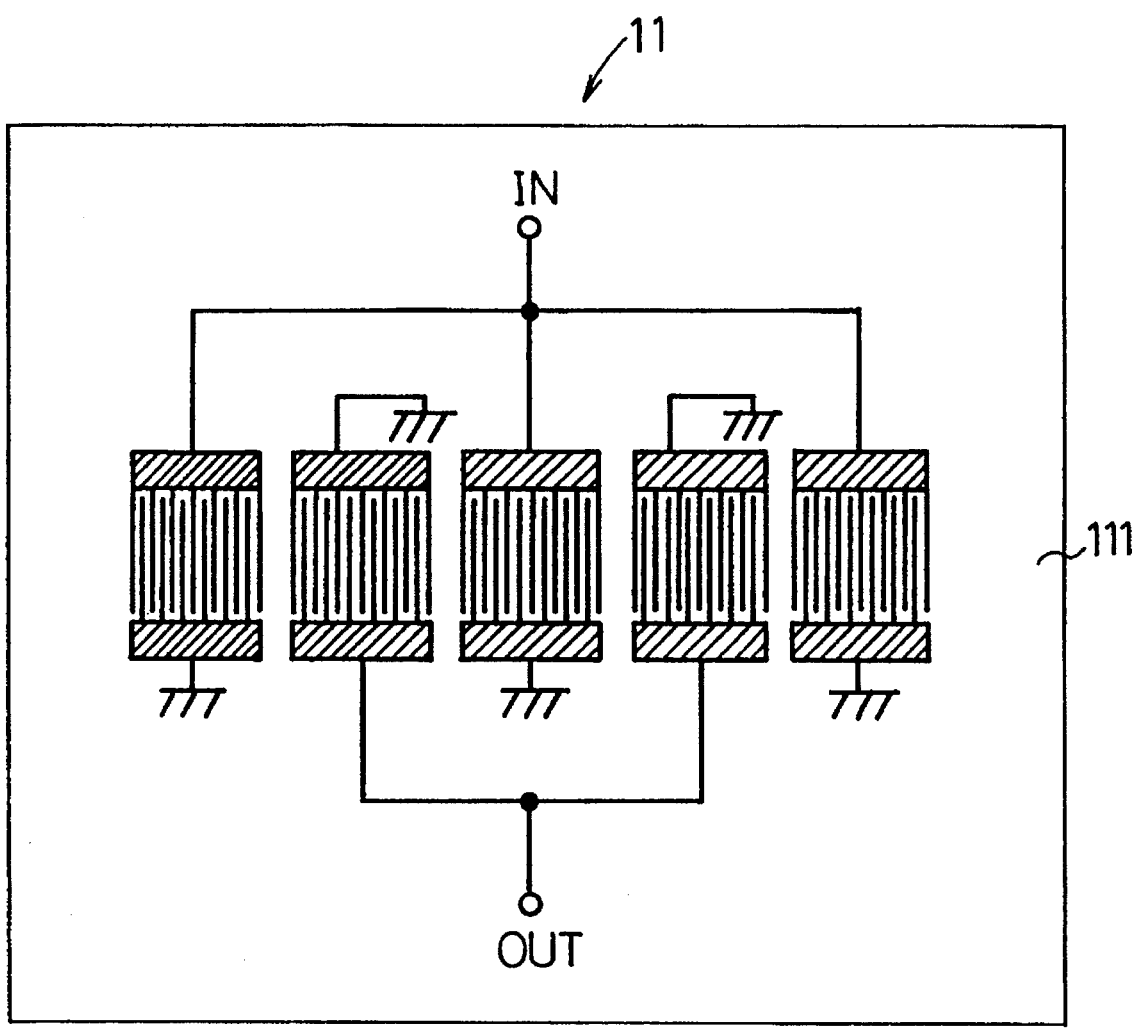
FIG. 19 is a schematic plan view of a conventional interdigitated interdigital surface acoustic wave filter with 5 transducers.
Figure 20A:
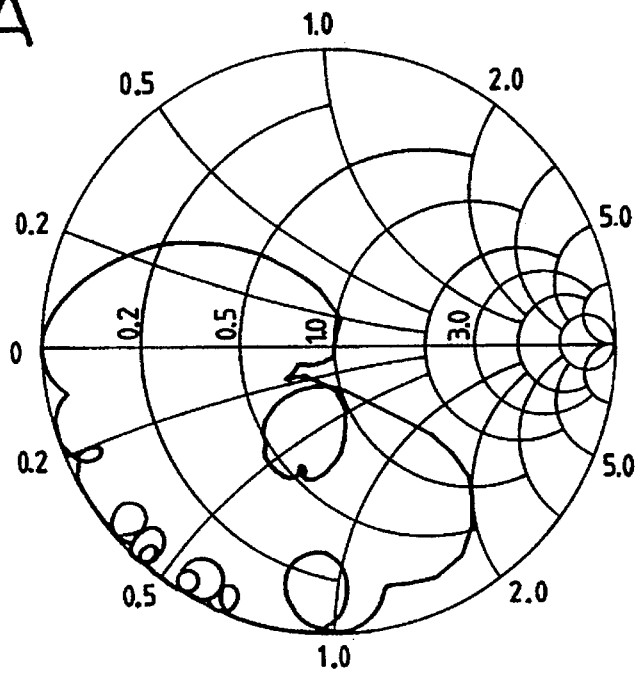
FIG. 20A is a diagram showing calculated impedances on input transducers of the interdigitated interdigital surface acoustic wave filter with normal transducers shown in FIG. 19.
Figure 20B:
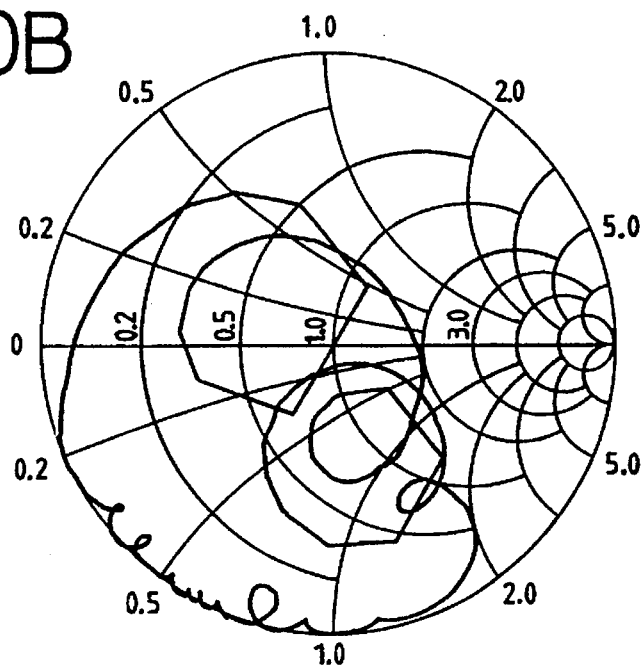
FIG. 20B is a diagram showing calculated impedances on output transducers of the interdigitated interdigital surface acoustic wave filter with normal transducers shown in FIG. 19.

FIG. 18 shows a portion of a mobile communication system which incorporates a composite surface acoustic wave filter according to the present invention.

The mobile communication system includes a double-conversion receiver. In the receiver, an output signal from an antenna 1090 is limited to a certain frequency band by a bandpass filter 1091 of an antenna sharing unit 1110, and then amplified by an RF amplifier 1092. The amplified signal is supplied to a bandpass filter 1093 for noise suppression, after which the signal is mixed with a signal having a first local frequency by a mixer 1096 for conversion into a first intermediate frequency signal. The first local frequency signal is supplied from a frequency synthesizer 1094 through a bandpass filter 1095. The first intermediate frequency signal is supplied to a bandpass filter 1097 which suppresses noise contained in the signal. Then, the first intermediate frequency signal is supplied to and amplified by a first intermediate frequency amplifier 1098. The amplified first intermediate frequency signal is then mixed with a signal having a second local frequency from the frequency synthesizer 1094 by a mixer 1099 for conversion into a second intermediate frequency signal. The second intermediate frequency signal is supplied to a bandpass filter 1100 which suppresses noise contained in the signal. Then, the second intermediate frequency signal is supplied to and amplified by a second intermediate frequency amplifier 1101. The amplified first intermediate frequency signal is demodulated by a demodulator 1102 into a demodulated signal, which is sent to a following circuit stage.

The mobile communication system also has a transmitter in which a carrier from the frequency synthesizer 1094 is modulated with an audio signal by a modulator 1103. The modulated signal from the modulator 1103 is then amplified by an amplifier 1104, which supplies the amplified signal to a mixer 1105. The mixer 1105 converts the supplied signal into an excitation signal with a local transmission frequency signal from the frequency synthesizer 1094. The excitation signal is amplified by an amplifier 1106 and limited to a certain frequency band by a bandpass filter 1107. The signal is then amplified by a power amplifier 1108, and transmitted from the antenna 1090 through a bandpass filter 1109 of the antenna sharing unit 1101.

The mobile communication system has transmission and reception signal frequency ranges that are close to each other. Therefore, the bandpass filters are required to have sharp cutoff characteristics and be small in size. Each of the bandpass filters 1091, 1109 in the antenna sharing unit 1110, the interstage bandpass filters 1093, 1107, and the bandpass filter 1095 for supplying the first local frequency signal therethrough from the frequency synthesizer 1094 to the mixer 1096 is composed of any of the composite surface acoustic wave filters 401 through 901 according to the fourth through ninth embodiments of the present invention. The bandpass filters 1091, 1109, 1093, 1107, 1095 thus constructed meet the requirements for sharp cutoff characteristics and small size.

Although certain preferred embodiments of the present invention has been shown and described in detail, it should be understood that various changes and modifications may be made therein without departing from the scope of the appended claims.

What is claimed is:

1. A composite surface acoustic wave filter comprising:

a surface acoustic wave filter producing a predetermined passband and having input and output terminals; and at least one surface acoustic wave resonator electrically connected in series to at least one of the input and output terminals of said surface acoustic wave filter, said resonator including impedance means for (a) having a low impedance at a resonant frequency thereof, (b) having a high impedance at an antiresonant frequency thereof which is set to be in the vicinity of said passband, and (c) operating as a capacitive element in said passband.

2. A composite surface acoustic wave filter according to claim 1, wherein said surface acoustic wave resonator has the at least said antiresonant frequency in a stop band which is close to and higher than said passband of said surface acoustic wave filter.

3. A composite surface acoustic wave filter according to claim 1, wherein said surface acoustic wave filter comprises an interdigitated interdigital surface acoustic wave filter comprising a plurality of input transducers electrically connected in parallel to each other, and a plurality of output transducers disposed between said input transducers and electrically connected in parallel to each other.

4. A composite surface acoustic wave filter according to claim 1, wherein said surface acoustic wave filter comprises a two-port surface acoustic wave resonator filter.

5. A composite surface acoustic wave filter according to claim 1, wherein said surface acoustic wave resonator comprises a one-port surface acoustic wave resonator.

6. A composite surface acoustic wave filter according to claim 1, further comprising a substrate, said surface acoustic wave filter and said surface acoustic wave resonator being mounted on said substrate.

7. A composite surface acoustic wave filter comprising:

a surface acoustic wave filter producing a predetermined passband and having input and output terminals; and at least one surface acoustic wave resonator electrically connected parallel to at least one of the input and output terminals of said surface acoustic wave filter, said resonator including impedance means for (a) having a low impedance at a resonant frequency thereof which is set to be in the vicinity of said passband, (b) having a high impedance at an antiresonant frequency thereof, and (c) operating as a capacitive element in said passband.

8. A composite surface acoustic wave filter according to claim 7, wherein said surface acoustic wave resonator has said resonant frequency in a stop band which is close to and lower than said passband of said surface acoustic wave filter.

9. A composite surface acoustic wave filter according to claim 7, wherein said surface acoustic wave filter comprises an interdigitated interdigital surface acoustic wave filter comprising a plurality of input transducers electrically connected parallel to each other, and a plurality of output transducers disposed between said input transducers and electrically connected parallel to each other.

10. A composite surface acoustic wave filter according to claim 7, wherein said surface acoustic wave filter comprises a two-port surface acoustic wave resonator filter.

11. A composite surface acoustic wave filter according to claim 7, wherein said surface acoustic wave resonator comprises a one-port surface acoustic wave resonator.

12. A composite surface acoustic wave filter according to claim 7, further comprising a substrate, said surface acoustic wave filter and said surface acoustic wave resonator being mounted on said substrate.

13. A composite surface acoustic wave filter comprising:

a surface acoustic wave filter producing a predetermined passband and having input and output terminals;

at least one first surface acoustic wave resonator electrically connected parallel to at least one of the input and output terminals of said surface acoustic wave filter; and at least one second surface acoustic wave resonator electrically connected in series to said surface acoustic wave filter;

wherein each one of said first and second surface acoustic wave resonators includes means for (a) having a low impedance at a resonant frequency thereof, (b) having a high impedance at an antiresonant frequency thereof, and (c) operates as a capacitive element in said passband;

wherein the resonant frequency of said first resonator is set to be in the vicinity of said passband, and the antiresonant frequency of said second resonator is set to be in the vicinity of said passband.

14. A composite surface acoustic wave filter according to claim 13, wherein said first surface acoustic wave resonator has said resonant frequency in a stop band which is close to and lower than said passband of said surface acoustic wave filter, and said second surface acoustic wave resonator has said antiresonant frequency in a stop band which is close to and higher than the passband of said surface acoustic wave filter.

15. A composite surface acoustic wave filter according to claim 13, wherein said surface acoustic wave filter comprises an interdigitated interdigital surface acoustic wave filter comprising a plurality of input transducers electrically connected parallel to each other, and a plurality of output transducers disposed between said input transducers and electrically connected parallel to each other.

16. A composite surface acoustic wave filter according to claim 13, wherein said surface acoustic wave filter comprises a two-port surface acoustic wave resonator filter.

17. A composite surface acoustic wave filter according to claim 13, wherein each of said first and second surface acoustic wave resonators comprises a one-port surface acoustic wave resonator.

18. A composite surface acoustic wave filter according to claim 13, further comprising a substrate, said surface acoustic wave filter and said first and second surface acoustic wave resonators being mounted on said substrate.

19. A mobile communication system including filters in an antenna sharing unit and interstage filters, each of said filters and said interstage filters comprising the composite acoustic surface wave filters according to claim 7.

20. A mobile communication system including filters in an antenna sharing unit and interstage filters, each of said filters and said interstage filters comprising the composite acoustic surface wave filter according to claim 8.

* * * * *

UNITED STATES PATENT AND TRADEMARK OFFICE
CERTIFICATE OF CORRECTION

PATENT NO. : 5,521,453
DATED : May 28, 1996
INVENTOR(S) : YATSUDA

It is certified that error appears in the above-indentified patent and that said Letters Patent is hereby corrected as shown below:

Column 24, line 14 (claim 2, line 3), delete "the at least".

Column 26, line 22 (claim 19, line 4),

"filters" should be --filter--.

Signed and Sealed this

Sixteenth Day of September, 1997

Attest:

BRUCE LEHMAN

Attesting Officer      Commissioner of Patents and Trademarks